United States Patent
Kim et al.

(10) Patent No.: US 8,866,180 B2
(45) Date of Patent: Oct. 21, 2014

(54) LIGHT EMITTING DEVICE, LIGHT EMITTING DEVICE PACKAGE, AND LIGHTING SYSTEM

(75) Inventors: Sung Kyoon Kim, Seoul (KR); Myeong Soo Kim, Seoul (KR); Woo Sik Lim, Seoul (KR); Min Gyu Na, Seoul (KR); Sung Ho Choo, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/031,803

(22) Filed: Feb. 22, 2011

(65) Prior Publication Data

US 2011/0204403 A1    Aug. 25, 2011

(30) Foreign Application Priority Data

Apr. 15, 2010   (KR) .................. 10-2010-0034862

(51) Int. Cl.
| | |
|---|---|
| *H01L 33/38* | (2010.01) |
| *H01L 33/60* | (2010.01) |
| *H01L 33/42* | (2010.01) |
| *H01L 33/40* | (2010.01) |
| *H01L 33/20* | (2010.01) |
| *H01L 33/00* | (2010.01) |

(52) U.S. Cl.
CPC ............... *H01L 33/382* (2013.01); *H01L 33/42* (2013.01); *H01L 33/387* (2013.01); *H01L 33/405* (2013.01); *H01L 33/20* (2013.01); *H01L 2933/0016* (2013.01); *H01L 33/007* (2013.01)
USPC   257/99; 257/98; 257/E33.062; 257/E33.065; 257/E33.072

(58) Field of Classification Search
CPC ....... H01L 33/20; H01L 33/32; H01L 33/382; H01L 33/387; H01L 33/405
See application file for complete search history.

(56) References Cited

U.S. PATENT DOCUMENTS

| | | | | |
|---|---|---|---|---|
| 4,535,219 | A | * | 8/1985 | Sliwa, Jr. ................. 219/121.63 |
| 2002/0063256 | A1 | | 5/2002 | Lin ................................. 257/79 |
| 2002/0185658 | A1 | * | 12/2002 | Inoue et al. ................... 257/200 |
| 2004/0130002 | A1 | | 7/2004 | Weeks et al. .................. 257/622 |

(Continued)

FOREIGN PATENT DOCUMENTS

| | | |
|---|---|---|
| EP | 1 460 694 | 9/2004 |
| JP | 08-083929 A | 3/1996 |

(Continued)

OTHER PUBLICATIONS

"Reflectance", The Penguin English Doctionary (2007). Retrieved from http://www.credoreference.com/entry/penguineng/reflectance.*

(Continued)

*Primary Examiner* — Johannes P Mondt
(74) *Attorney, Agent, or Firm* — Ked & Associates, LLP

(57) ABSTRACT

Provided are a light emitting device, a light emitting device package, and a lighting system. The light emitting device includes a substrate, a light emitting structure layer, a second electrode, a first electrode, a contact portion, and a first electrode layer. The first electrode is disposed in the substrate from a lower part of the substrate to a lower part of a first conductive type semiconductor layer in a region under an active layer. The contact portion is wider than the first electrode and makes contact with the lower part of the first conductive type semiconductor layer. The first electrode layer is disposed under the substrate and connected to the first electrode.

20 Claims, 12 Drawing Sheets

(56) References Cited

U.S. PATENT DOCUMENTS

| | | | |
|---|---|---|---|
| 2005/0104081 A1 | 5/2005 | Kim et al. | 257/99 |
| 2006/0145174 A1* | 7/2006 | Lee et al. | 257/98 |
| 2007/0069222 A1* | 3/2007 | Ko et al. | 257/86 |
| 2009/0152583 A1* | 6/2009 | Chen et al. | 257/98 |
| 2009/0179209 A1 | 7/2009 | Xuan et al. | 257/94 |
| 2010/0244083 A1* | 9/2010 | Kim | 257/99 |

FOREIGN PATENT DOCUMENTS

| | | |
|---|---|---|
| KR | 10-2005-0093876 A | 9/2005 |
| KR | 10-0632006 B1 | 9/2006 |
| KR | 10-2007-0034716 A | 3/2007 |
| KR | 10-2007-0037593 A | 4/2007 |
| KR | 10-2008-0076308 A | 8/2008 |

OTHER PUBLICATIONS

"Reflectivity", Hargrave' Communications Dictionary (2001), Wiley. Retrieved from http://www.credoreference.com/entry/hargravecomms/reflectivity.*

European Search Report issued in related Application No. 11153926.8 dated Mar. 10, 2014.

* cited by examiner

LIGHT EMITTING DEVICE, LIGHT EMITTING DEVICE PACKAGE, AND LIGHTING SYSTEM

CROSS-REFERENCE TO RELATED APPLICATIONS

The present application claims priority under 35 U.S.C. §119(a) of Korean Patent Application No. 10-2010-0034862 filed on Apr. 15, 2010, which is hereby incorporated by reference in its entirety.

BACKGROUND

Embodiments relate to a light emitting device, a light emitting device package, and a lighting system.

Due to physical and chemical characteristics, group III-V nitride semiconductors are being considered as core materials for light-emitting devices such as light-emitting diodes (LEDs) and laser diodes (LDs). Generally, group III-V nitride semiconductors are formed of a semiconductor material having a compositional formula of $In_xAl_yGa_{1-x-y}N$ ($0 \le x \le 1$, $0 \le y \le 1$, $0 \le x+y \le 1$).

LEDs are a kind of semiconductor device that is used as a light source or used to transmit a signal by converting electricity into infrared rays or light by using the characteristics of compound semiconductors.

Such LEDs or LDs using a nitride semiconductor material are widely used as light-emitting devices. For example, LEDs and LDs are widely used as light sources of various products such as keypad light-emitting units of cellular phones, electric displays, and lighting devices.

SUMMARY

Embodiments provide a light emitting device having a new electrode structure.

Embodiments provide a light emitting device including a growth substrate and a vertical electrode structure.

Embodiments provide a light emitting device including a first electrode disposed under a region of an active layer and a second electrode disposed on a region of the active layer.

Embodiments provide a light emitting device, a light emitting device package, and a lighting system that are more reliable.

In one embodiment, a light emitting device including: a substrate; a light emitting structure layer comprising a first conductive type semiconductor layer, an active layer on the first conductive type semiconductor layer, and a second conductive type semiconductor layer on the active layer; a second electrode on the light emitting structure; a first electrode disposed in the substrate and extended from a lower part of the substrate to a lower part of the first conductive type semiconductor layer, the first electrode being disposed under a region of the active layer; a contact portion having a width wider than a width of the first electrode disposed in the substrate and disposed at the lower part of the first conductive type semiconductor layer; and a first electrode layer disposed under the substrate and connected to the first electrode.

In another embodiment, a light emitting device including: a transmittive substrate; a first electrode layer under the substrate; a light emitting structure layer comprising a first conductive type semiconductor layer, an active layer on the first conductive type semiconductor layer, and a second conductive type semiconductor layer on the active layer; a plurality of first electrodes disposed in the substrate and extended from the first electrode layer to a lower part of the first conductive type semiconductor layer; a second electrode layer on the light emitting structure layer; a second electrode on the second electrical layer; and a contact portion contacted with the lower part of the first conductive type semiconductor layer disposed under the active layer and having a width different from a width of the first electrode disposed in the substrate.

In further another embodiment, a light emitting device package including: a body; a plurality of lead electrodes on the body; a light emitting device on at least one of the lead electrodes; and a molding member covering the light emitting device, wherein the light emitting device includes: a substrate; a light emitting structure layer comprising a first conductive type semiconductor layer, an active layer on the first conductive type semiconductor layer, and a second conductive type semiconductor layer on the active layer; a second electrode on the light emitting structure; a first electrode disposed in the substrate and extended from a lower part of the substrate to a lower part of the first conductive type semiconductor layer, the first electrode being disposed under a region of the active layer; a contact portion having a width wider than a width of the first electrode disposed in the substrate and disposed at the lower part of the first conductive type semiconductor layer; and a first electrode layer disposed under the substrate and connected to the first electrode.

The details of one or more embodiments are set forth in the accompanying drawings and the description below. Other features will be apparent from the description and drawings, and from the claims.

DETAILED DESCRIPTION OF THE EMBODIMENTS

Figure 1:
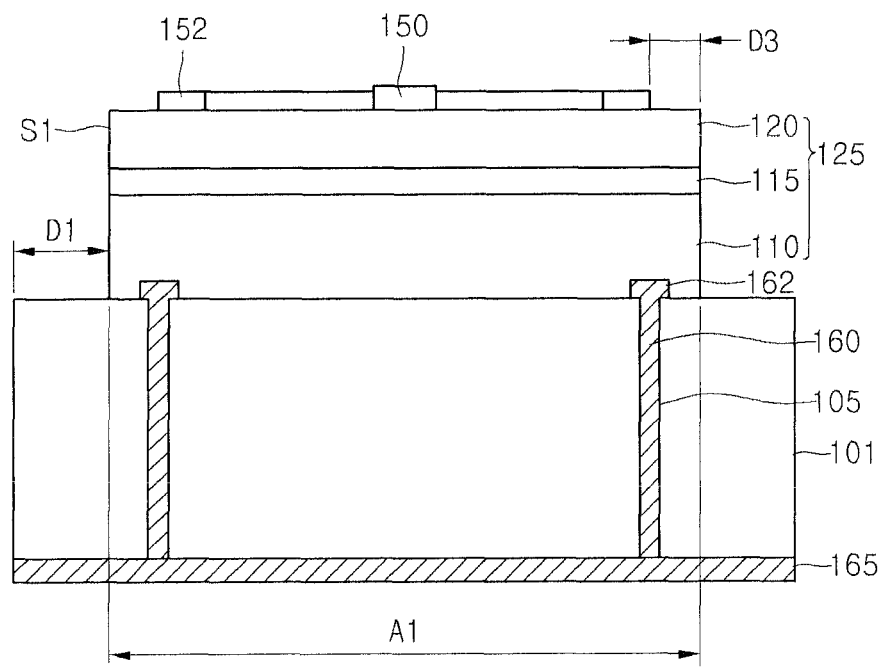
FIG. 1 is a side sectional view illustrating a light emitting device according to a first embodiment.

In the descriptions of embodiments, it will be understood that when a layer (or film), a region, a pattern, or a structure is referred to as being on a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

Hereinafter, exemplary embodiments will be described with reference to the accompanying drawings. In the drawings, the thickness or size of each layer is exaggerated, omitted, or schematically illustrated for convenience in description and clarity. Also, the size of each element does not entirely reflect an actual size.

Hereinafter, exemplary embodiments will be described with reference to the accompanying drawings.

Figure 2:
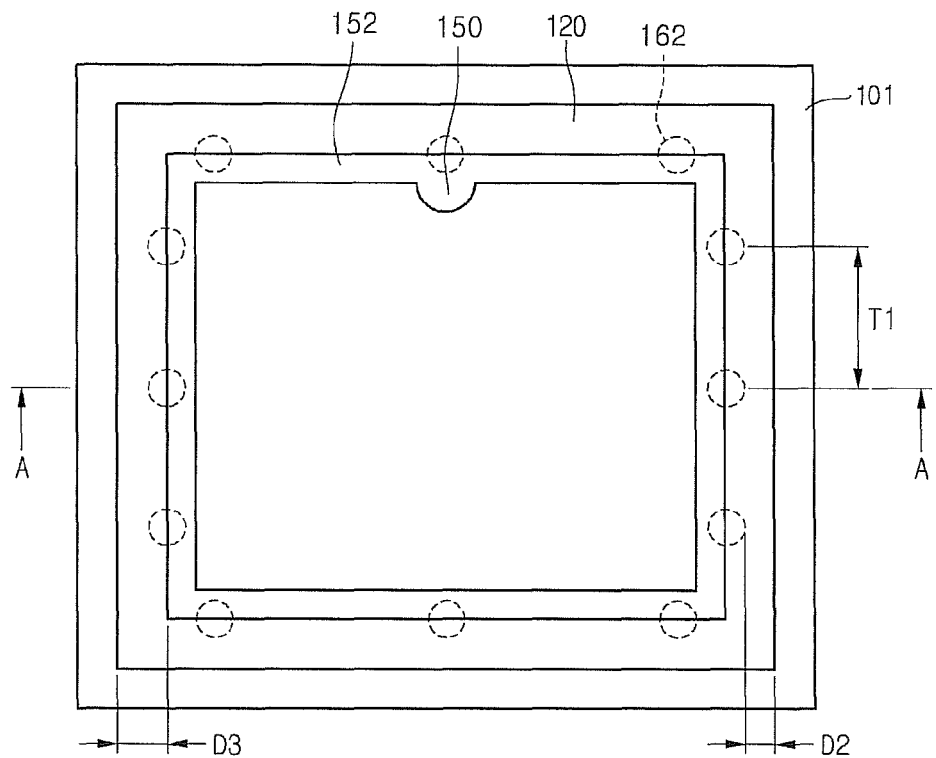
FIG. 2 is a plan view illustrating the light emitting device of FIG. 2.

FIG. 1 is a side sectional view illustrating a light emitting device 100 according to a first embodiment, and FIG. 2 is a plan view illustrating the light emitting device 100 of FIG. 1.

Referring to FIG. 1, the light emitting device 100 includes a substrate 101, a first conductive type semiconductor layer 110, an active layer 115, a second conductive type semiconductor layer 120, second electrode parts 150 and 152, a first electrode 160, and a first electrode layer 165.

The light emitting device 100 includes a light emitting diode (LED) including a plurality of compound semiconductor layers such as group III-V compound semiconductor layers. The LED may be a light emitting diode chip emitting visible light such as blue, green, or red light or an ultraviolet (UV) light emitting diode chip emitting ultraviolet light. The light emitting diode chip may emit light by using a variety of semiconductors in the technical scope of the embodiment.

The substrate 101 is an insulating or conductive growth substrate on which a compound semiconductor can be grown. The substrate 101 may be formed of a material selected from the group consisting of $Al_2O_3$ (sapphire), GaN, SiC, ZnO, Si, GaP, InP, $Ga_2O_3$, and GaAs. In the embodiment, the substrate 101 may be an insulating substrate such as a sapphire substrate, and the insulating substrate may be a transmittive substrate.

A light extracting structure disposed on the substrate 101 may include a concave-convex structure or a rough structure. The thickness of the substrate 101 may be at least ten times the thickness of a light emitting structure layer 125. For example, the thickness of the substrate 101 may be in the range from about 50 μm to about 500 μm. If the substrate 101 is formed of a transmittive material, light emitting angle can be improved.

In addition, the substrate 101 may include a material the lattice constant of which is different from the lattice constant of the compound semiconductor layers. However, the substrate 101 is not limited thereto.

At least one compound semiconductor layer may be disposed between the substrate 101 and the first conductive type semiconductor layer 110. The compound semiconductor layer may be a layer or pattern formed of a group II to VI compound semiconductor such as ZnO, GaN, AlN, AlGaN, InGaN, InN, InAlGaN, AlInN, AlGaAs, GaP, GaAs, GaAsP, or AlGaInP. For example, the compound semiconductor layer may include a buffer layer and/or undoped semiconductor layer, and the buffer may reduce the lattice constant difference between the compound semiconductor and the substrate 101. For example, the undoped semiconductor layer is a nitride-based semiconductor layer in which a conductive type dopant is not intentionally doped. The undoped semiconductor layer may be a semiconductor layer having significantly low conductivity than that of the first conductive type semiconductor layer 110. For example, the undoped semiconductor layer may be an undoped GaN layer and have a first conductive type characteristic.

The first conductive type semiconductor layer 110 is disposed on the substrate 101 or the compound semiconductor layer. The first conductive type semiconductor layer 110 is disposed between the substrate 101 and the active layer 115, and the active layer 115 is disposed between the first conductive type semiconductor layer 110 and the second conductive type semiconductor layer 120. Another semiconductor layer may be further disposed on or under each of the layers. However, the embodiment is not limited thereto. Here, the other semiconductor layer includes a layer, which has a different composition constituted by group III-V elements or a different conductive type dopant concentration.

The light emitting structure layer 125 includes the first conductive type semiconductor layer 110, the active layer 115, and the second conductive type semiconductor layer 120.

The first conductive type semiconductor layer 110 may be formed of a group III-V compound semiconductor doped with a first conductive type dopant, such as GaN, AlN, AlGaN, InGaN, InN, InAlGaN, AlInN, AlGaAs, GaP, GaAs, GaAsP, or AlGaInP. The first conductive type semiconductor layer 110 may be formed of a semiconductor material having a compositional formula of $In_xAl_yGa_{1-x-y}N$ ($0 \leq x \leq 1$, $0 \leq y \leq 1$, $0 \leq x+y \leq 1$). The first conductive type semiconductor layer 110 may be an N-type semiconductor layer. The N-type semiconductor layer includes an N-type dopant such as Si, Ge, Sn, Se, or Te. The first conductive type semiconductor layer 110 may be formed in a single- or multi-layer structure, but is not limited thereto.

The first conductive type semiconductor layer 110 may have a super lattice structure (SLS) in which different semiconductor layers are stacked. The super lattice structure may include a structure such as a GaN/InGaN structure or a GaN/AlGaN structure. The super lattice structure may include a structure in which at least two pairs of different layers each having a thickness of about several angstroms (Å) or more are alternately stacked.

The width of the first conductive type semiconductor layer 110 may be equal to or greater than the width of the active layer 115, and equal to or smaller than the width of the substrate 101. Here, at least one side of the light emitting structure layer 125 may be spaced apart from a side of the substrate 101 by a predetermined distance D1, and an outer region of the topside of the substrate 101 may be opened. The first conductive type semiconductor layer 110 may be thicker than at least the active layer 115.

The active layer 115 is disposed on the first conductive type semiconductor layer 110, and the active layer 115 may has at least one of a single quantum well structure, a multi quantum well structure, a quantum wire structure, and a quantum dot structure. The active layer 115 may be formed of a group III-V compound semiconductor material and include a period of well layer/barrier layer. For example, the active layer 115 may include at least one of a period of InGaN well layer/GaN barrier layer, a period of InGaN well layer/AlGaN barrier layer, and a period of InGaN well layer/InGaN barrier layer.

A first conductive type clad layer may be disposed between the first conductive type semiconductor layer 110 and the active layer 115. The first conductive type clad layer may be formed of a GaN-based semiconductor. The first conductive type clad layer may have a band gap greater than that of the barrier layer within the active layer 115 and function to confine carriers.

A second conductive type clad layer may be disposed between the active layer 115 and the second conductive type semiconductor layer 120. The second conductive type clad layer may be formed of a GaN-based semiconductor. The second conductive type clad layer may have a band gap greater than that of the barrier layer within the active layer 115 and function to confine carriers. The width of the active layer 115 may be smaller than that of the substrate 101.

The second conductive type semiconductor layer 120 is disposed on the active layer 115. The second conductive type semiconductor layer 120 may be formed of a group III-V compound semiconductor doped with a second conductive type dopant, such as GaN, AlN, AlGaN, InGaN, InN, InAlGaN, AlInN, AlGaAs, GaP, GaAs, GaAsP, or AlGaInP. The second conductive type semiconductor layer 120 may be formed of a semiconductor material having a compositional formula of $In_xAl_yGa_{1-x-y}N$ ($0 \le x \le 1$, $0 \le y \le 1$, $0 \le x+y \le 1$).

The second conductive type semiconductor layer 120 may have a single- or multi-layered structure. When the second conductive type semiconductor layer 120 has a multi-layered structure, the second conductive type semiconductor layer 120 may have a super lattice structure such as an AlGaN/GaN structure or a stacked structure of layers having different dopant concentrations.

The second conductive type semiconductor layer 110 may be a P-type semiconductor layer. The P-type semiconductor layer includes a P-type dopant such as Mg, Be, or Zn. The second conductive type semiconductor layer 120 may function as an electrode contact layer, but is not limited thereto. The topside of the second conductive type semiconductor layer 120 may has a rough structure, but is not limited thereto.

In addition, a third conductive type semiconductor layer having a polarity opposite to that of the second conductive type may be disposed on the second conductive type semiconductor layer 120. The light emitting structure layer 125 may have at least one of an N-P junction structure, a P-N junction structure, an N-P-N junction structure, and a P-N-P junction structure. Here, N denotes an N-type semiconductor layer, P denotes a P-type semiconductor layer, and '-' denotes a directly or indirectly stacked structure of two semiconductor layers. Hereinafter, a structure in which the second conductive type semiconductor layer 120 is the uppermost layer of the light emitting structure layer 125 will be described as an example.

The second electrode parts 150 and 152 may be electrically connected to the second conductive type semiconductor layer 120. The second electrode parts 150 and 152 may be disposed on the second conductive type semiconductor layer 120. The second electrode parts 150 and 152 includes a pad 150 and a second electrode 152 electrically connected to the pad 150.

The second electrode parts 150 and 152 may be formed into a single layer or multi layers by using at least one selected from the group consisting of Ti, Al, Al alloy, In, Ta, Pd, Co, Ni, Si, Ge, Ag, Ag alloy, Au, Hf, Pt, Ru, Au, and an alloy thereof. The number of the pad 150 may be at least one, and the width of the pad 150 may be greater than that of the second electrode 152. The second electrode 152 may extend from the pad 150 at least in one direction.

The second electrode 152 may be electrically connected to the pad 150 and have at least a branch, arm, or finger shape.

The pad 150 may be disposed at an edge side when viewed from a chip top side. Alternatively, the pad 150 may be disposed at a center part.

The second electrode 152 may branch from the pad 150 in a loop shape. The loop shape may be a closed or open loop shape. For example, the second electrode 152 may have one of the following pattern shapes: a radial pattern, at least one branch pattern, a curve pattern, a linear pattern, a polygonal pattern, a circular pattern, and a combination thereof. However, the shape of the second electrode 152 is not limited there to A second electrode layer formed of a material different from the above-described semiconductor layers may be disposed between the second electrode parts 150 and 152 and the second conductive type semiconductor layer 120. The second electrode layer may include any one of an ohmic layer, a current diffusion layer, and a transmittive conductive layer. The second electrode layer may include a transmittive oxide or nitride. For example, the second electrode layer may be formed into a single-layer or multilayer structure by using at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni, Ag, Ni/IrOx/Au, and Ni/IrOx/Au/ITO. The second electrode layer may diffuse a current and supply the diffused current to the second conductive type semiconductor layer 120.

The second electrode 152 is disposed in an edge region of the second conductive type semiconductor layer 120, and the edge region is spaced apart from a side S1 of the second conductive type semiconductor layer 120 by a distance D3.

At least one first electrode 160 may be provided. For example, a plurality of first electrodes 160 may be disposed at predetermined intervals under a light emitting region, for example, under the active layer 115. In this case, a process of etching a part of the active layer 115 may not be necessary to form the first electrode 160, and thus a light emitting may not be reduced.

The first electrode 160 may be formed of a metal including at least one selected from the group consisting of Cu, Ti, Cr, Ta, Al, In, Pd, Co, Ni, Ge, Ag, and Au, but is not limited thereto.

A hole 105 is formed in the substrate 101. For example, the hole 105 may be a via hole or a through hole penetrating the substrate 101 from the topside to the lower side of the substrate 101. The hole 105 may have a line shape perpendicular to or oblique to the lower side of the substrate 101.

As many holes 105 as the number of the first electrodes 160 may be formed, and the first electrodes 160 may be disposed in the holes 105. The hole 105 may have a circular section or a polygonal section.

The first electrode 160 electrically connects the first conductive type semiconductor layer 110 and the first electrode layer 165.

A contact portion 162 of the first electrode 160 may make contact with at least a lower part of the first conductive type semiconductor layer 110. For example, the contact portion 162 may be embedded through the lower surface of the first conductive type semiconductor layer 110. The lower surface of the first conductive type semiconductor layer 110 may be a N-face and make contact with the contact portion 162.

If the first conductive type semiconductor layer 110 makes direct contact with the substrate 101, the lower surface of the contact portion 162 of the first electrode 160 is disposed on the top surface of the substrate 101.

The diameter or width of the first electrode 160 disposed in the substrate 101 may be about 0.5 μm to about 50 μm. The diameter of width of the contact portion 162 of the first electrode 160 may be different from that of the first electrode 160 disposed in the substrate 101. For example, the diameter of width of the contact portion 162 of the first electrode 160 may be greater than that of the first electrode 160 disposed in the substrate 101.

The diameter (or width) of the contact portion 162 of the first electrode 160 may be about 2 µm to about 50 µm, and the thickness of the contact portion 162 may be about 10 Å to about 30000 Å. The contact portion 162 of the first electrode 160 may be thinner than at least the first conductive type semiconductor layer 110.

If a plurality of first electrodes 160 are provided, the first electrodes 160 may be connected to each other. The contact portions 162 of the first electrodes 160 may be connected to each other through at least two conductive layers, and the conductive layers may include a metal material which is more conductive than the above-described semiconductor layers.

The conductive layers may include a pattern having an arm structure, a branch structure, or a loop structure. The conductive layers may be disposed on the lower surface of the first conductive type semiconductor layer 110 and/or the top surface of the substrate 101, but are not limited thereto.

As shown in FIG. 2, the first electrodes 160 may be distributed under the light emitting structure layer 125, for example, under the second conductive type semiconductor layer 120, to supply a current uniformly. FIG. 1 is a side sectional view taken along line A-A of FIG. 2, illustrating edge parts of the substrate 101 non-overlapping with the light-emitting structure.

The first electrodes 160 may be arranged at regular, random, or irregular intervals T1. The intervals T1 may be varied according to current efficiency and the pattern of the second electrode 152.

The first electrodes 160 are spaced apart from a side of the light emitting structure layer 125, for example, a side of the second conductive type semiconductor layer 120 by a predetermined distance D2. Thus, the first electrodes 160 may be disposed in a region disposed under the light emitting structure layer 125.

The pad 150 and the second electrode 152 may be closer to the edges of the second conductive type semiconductor layer 120 than to the center of the second conductive type semiconductor layer 120. In FIG. 2, the pad 10 is disposed between corners. However, the pad 150 may be disposed on a corner, but is not limited thereto. For example, the second electrode 152 may have one of the following pattern shapes: a radial pattern, at least one branch pattern, a curve pattern, a linear pattern, a polygonal pattern, a circular pattern, and a combination thereof. However, the shape of the second electrode 152 is not limited there to.

The first electrodes 160 may be disposed closer to the second electrode 152 than to a top center region of the second conductive type semiconductor layer 120 to diffuse a current to the whole region. This electrode arrangement structure may facilitate diffusion of a current to edge regions to improve internal quantum efficiency.

Referring to FIGS. 1 and 2, the distance between the contact portion 162 of the first electrode 160 and the second electrode 152 may be smaller than at least the thickness of the light emitting structure layer 125.

The contact portion 162 of the first electrodes 160 may be disposed in a region overlapping with at least a portion of the second electrode 152 or in a region outside the second electrode 152.

The first electrode layer 165 may be disposed under the substrate 101 to connect the plurality of first electrodes 160.

The first electrode layer 165 may be formed of the same material as a first electrode material or a material different from the first electrode material. The first electrode layer 165 may be formed of a metal material having 50% or greater reflectivity and may be used as a reflection layer. The first electrode layer 165 may be formed into a single-layer or multilayer structure by using a conductive material that easily adheres to the substrate 101. The lower surface of the first electrode layer 165 may be smaller than at least the lower surface of the substrate 101 but great than at least the lower surface of the first conductive type semiconductor layer 110 or the active layer 115.

The first electrode layer 165 may be disposed on the lower surface of the substrate 101 entirely or partially and be formed into a single pattern or a plurality of patterns. However, the first electrode layer 165 is not limited thereto.

A reflection layer may be further disposed between the substrate 101 and the light emitting structure layer 125. The reflection layer may be formed as a distributed Bragg reflector (DBR) by stacking at least two group III-V compound semiconductor layers (AlN/GaN) having different refractive indexes in a super lattice structure (at least once period). The reflection layer may be formed of a different material according to semiconductor crystal or growth conditions.

As shown in FIG. 1, in the case where the substrate 101 of the light emitting device 100 having a vertical electrode structure is transmittive, the critical angle of light can be changed by adjusting the thickness of the substrate 101, and thus light extraction efficiency can be improved.

FIGS. 3 to 7 are views for explaining processes of manufacturing the light emitting device of FIG. 1.

Figure 3:
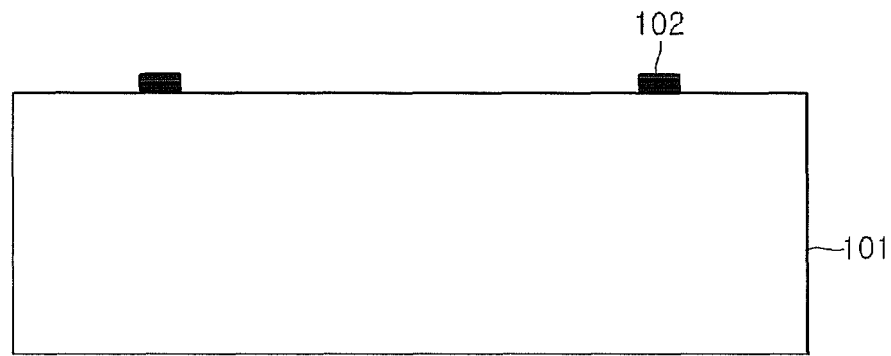
FIGS. 3 to 7 are views for explaining processes of manufacturing the light emitting device of FIG. 1.

Referring to FIG. 3, a substrate 101 may be loaded on growth equipment, and a layer or pattern may be formed on the substrate 101 by using a group II to VI compound semiconductor.

Examples of the growth equipment includes an E-beam evaporator equipment, physical vapor deposition (PVD) equipment, chemical vapor deposition (CVD) equipment, plasma laser deposition (PLD) equipment, a dual-type thermal evaporator, sputtering equipment, and metal organic chemical vapor deposition (MOCVD) equipment. However, the growth equipment is not limited thereto.

The substrate 101 may be a conductive or insulating substrate formed of a material selected from the group consisting of $Al_2O_3$ (sapphire), GaN, SiC, ZnO, Si, GaP, InP, $Ga_2O_3$, and GaAs. A concave-convex structure having a lens or stripe shape may be formed on the substrate 101. The concave-convex structure may be a patterned structure or a rough structure.

The thickness of the substrate 101 may be in the range from about 30 µm to about 500 µm. The thickness of the substrate 101 may be varied according to lapping and/or polishing.

In addition, a compound semiconductor layer may be formed on the substrate 101. The compound semiconductor layer may be a layer or pattern formed of a group II to VI compound semiconductor. For example, at least one of a ZnO layer, a buffer layer, and an undoped semiconductor layer may be formed. The buffer layer or the undoped semiconductor layer may be formed of a group III-V compound semiconductor. The buffer layer may function to reduce a lattice constant difference from that of the substrate 101. The undoped semiconductor layer may a less conductive layer than a first conductive type semiconductor layer. The undoped semiconductor layer may be formed of an undoped GaN-based semiconductor.

A reflection layer 102 may be formed on the substrate 101 in different regions of the substrate 101. A plurality of patterns may be formed as the reflection layer 102 by a photoresist process using a mask, and the patterns may be spaced apart from each other to form a circular or polygonal shape.

Alternatively, the reflection layer 102 may formed into a pattern having a loop shape (open loop or closed loop) such as a ring shape, a band shape, and a frame shape; or a radial or polygonal pattern. However, the reflection layer 102 is not limited thereto.

The reflection layer 102 may be formed into a super lattice structure. For example, the reflection layer 102 may be formed into a distributed Bragg reflector (DBR) structure by alternately stacking at least two layers (such as AlN/GaN) having different refractive indexes at least once. A material of the reflection layer 102 includes an oxide-based material and/or a nitride-based material. The reflection layer 102 may be formed of a metal having a high melting point. For example, the reflection layer 102 may be formed of at least one metal selected from the group consisting of W and Mo. Alternatively, the reflection layer 102 may be formed into a multilayer structure such as a W/Mo stacked structure. In addition, the reflection layer 102 may include a super lattice structure such as Si/Mo and Mo/Si. The reflection layer 102 may be formed of a material durable at high temperature, for example, 1000□ or higher and having at least 50% reflectivity. In addition, the reflection layer 102 has a structure of Omni-Directional Reflective (ODR) using at least metal layer such as Ti, Ta, W, Mo and alloy thereof.

An absorption layer may be formed under the reflection layer 102 to absorb laser light by using a material having a band gap smaller than that of the substrate 101. The absorption layer includes at least one selected from the group consisting of ZnO, $TiO_2$, $SiO_2$, $Si_3N_4$, TiN, AlN, GaN, W, Ta, and Mo. Alternatively, the absorption layer may be formed of a metallic material and may be formed in a reflection layer region. During a laser hole machining process, the absorption layer may absorb laser light to protect a light emitting structure layer. However, this is a non-limiting example. Here, reflectivity with respect to a laser light source may be varied according to the thickness of W and Mo.

The width of the reflection layer 102 and/or the width of the absorption layer may be in the range from about 2 μm to about 50 μm, and the thickness of the reflection layer 102 and/or the thickness of the absorption layer may be in the range from about 10 Å to about 30000 Å.

Here, patterns of the reflection layer 102 disposed in different regions may be connected to each other. In this case, the reflection layer 102 may function as a conductive pattern when a first electrode is formed.

Figure 4:
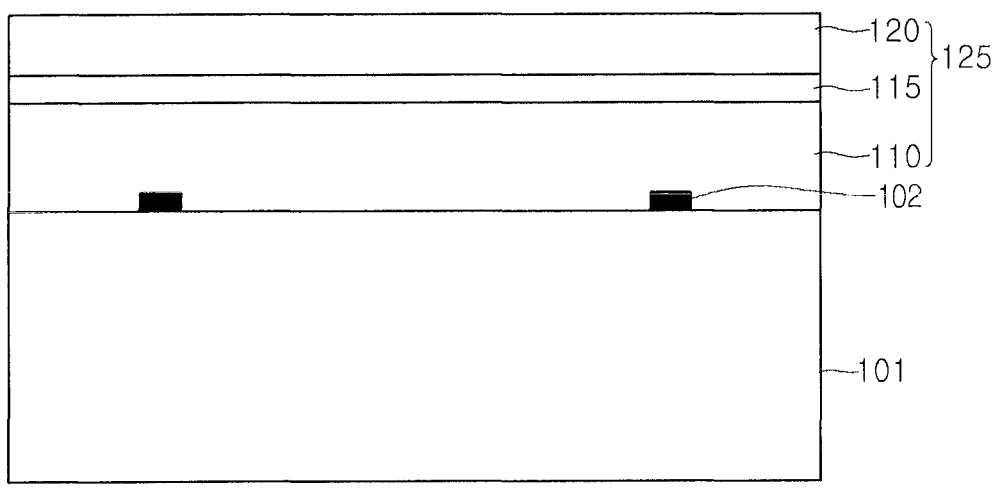

Referring to FIG. 4, a first conductive type semiconductor layer 110 is formed on the substrate 101 or the compound semiconductor layer, and an active layer 115 is formed on the first conductive type semiconductor layer 110. A second conductive type semiconductor layer 120 is formed on the active layer 115. Another semiconductor layer may be further disposed on or under each of the layers. However, this is a non-limiting example.

The reflection layer 102 is disposed at least on a lower part of the first conductive type semiconductor layer 110, and the lower surface of the first conductive type semiconductor layer 110 is an N-face having a surface roughness greater than that of a Ga-face. The reflection layer 102 may extend from the lower surface to an inner part of the first conductive type semiconductor layer 110.

The first conductive type semiconductor layer 110 may be formed of a group III-V compound semiconductor doped with a first conductive type dopant, such as GaN, AlN, AlGaN, InGaN, InN, InAlGaN, AlInN, AlGaAs, GaP, GaAs, GaAsP, or AlGaInP. The first conductive type semiconductor layer 110 may be formed of a semiconductor material having a compositional formula of $In_xAl_yGa_{1-x-y}N$ (0≤x≤1, 0≤y≤1, 0≤x+y≤1). The first conductive type semiconductor layer 110 may be an N-type semiconductor layer. The N-type semiconductor layer includes an N-type dopant such as Si, Ge, Sn, Se, or Te. The first conductive type semiconductor layer 110 may function as an electrode contact layer and be formed into a single-layer or multilayer structure. However, the first conductive type semiconductor layer 110 is not limited thereto.

The first conductive semiconductor layer 110 may have a super lattice structure in which different semiconductor layers are alternately stacked. The super lattice structure may include a structure such as a GaN/InGaN structure or a GaN/AlGaN structure.

The active layer 115 is formed on the first conductive semiconductor layer 110, and the active layer 115 may has at least one of a single quantum well structure, a multi quantum well structure, a quantum wire structure, and a quantum dot structure. The active layer 115 may be formed of a group III-V compound semiconductor material and have a period of well layer/barrier layer. For example, the active layer 115 may have at least one of a period of InGaN well layer/GaN barrier layer, a period of InGaN well layer/AlGaN barrier layer, and a period of InGaN well layer/InGaN barrier layer.

A first conductive type clad layer may be disposed between the first conductive type semiconductor layer 110 and the active layer 115. The first conductive type clad layer may be formed of a GaN-based semiconductor. The first conductive type clad layer may have a band gap greater than that of the barrier layer within the active layer 115 and function to confine carriers.

A second conductive type clad layer may be disposed between the active layer 115 and the second conductive type semiconductor layer 120. The second conductive type clad layer may be formed of a GaN-based semiconductor. The second conductive type clad layer may have a band gap greater than that of the barrier layer within the active layer 115 and function to confine carriers.

The second conductive type semiconductor layer 120 is disposed on the active layer 115. The second conductive type semiconductor layer 120 may be formed of a group III-V compound semiconductor doped with a second conductive type dopant, such as GaN, AlN, AlGaN, InGaN, InN, InAlGaN, AlInN, AlGaAs, GaP, GaAs, GaAsP, or AlGaInP. The second conductive type semiconductor layer 120 may be formed of a semiconductor material having a compositional formula of $In_xAl_yGa_{1-x-y}N$ (0≤x≤1, 0≤y≤1, 0≤x+y≤1).

The second conductive type semiconductor layer 120 may has a single-layer or multilayer structure. In the case where the second conductive type semiconductor layer 120 has a multilayer structure, the second conductive type semiconductor layer 120 may have a super lattice structure such as AlGaN/GaN.

The second conductive type semiconductor layer 110 may be a P-type semiconductor layer. The P-type semiconductor layer includes a P-type dopant such as Mg, Be, or Zn. The second conductive type semiconductor layer 120 may function as an electrode contact layer, but is not limited thereto.

The first conductive type semiconductor layer 110, the active layer 115, and the second conductive type semiconductor layer 120 may be defined as a light emitting structure layer 125. In addition, a third conductive type semiconductor layer having a polarity opposite to that of the second conductive type may be formed on the second conductive type semiconductor layer 120. The light emitting structure layer 125 may have at least one of an N-P junction structure, a P-N junction structure, an N-P-N junction structure, and a P-N-P junction structure. Hereinafter, a structure in which the second conductive type semiconductor layer 120 is an upper layer of the light emitting structure layer 125 will be described as an example.

Figure 5:
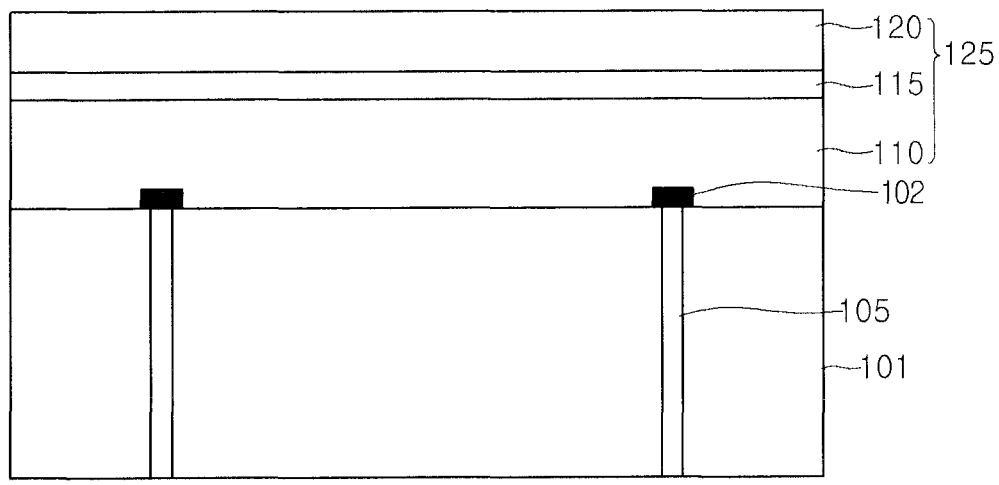

Referring to FIG. 5, holes 105 are formed in the substrate 101. The holes 105 may penetrate at least the substrate 101. The holes 105 may be formed to be connected to the reflection layer 102 by induced laser light to the lower surface of the substrate 101. The holes 105 may be located at the reflection layer 102 at positions corresponding to each other. When the holes 105 are formed, the reflection layer 102 may reflect laser light to protect the light emitting structure layer 125.

The holes 105 may have a diameter in the range from about 0.5 µm to about 50 µm. The holes 105 may be formed in a line shape perpendicular to the lower surface of the substrate 101 or a non-linear shape. For example, the holes 105 may have a via hole structure or a through hole structure. The holes 105 may have a circular section or a polygonal shape. The diameter or width of the holes 105 may be varied according to the positions of the holes 105 in the substrate 101.

The holes 105 may be formed after placing a protective sheet on the light emitting structure layer 125 and turning the substrate 101 over to place the light emitting structure layer 125 at a lower position.

Figure 6:
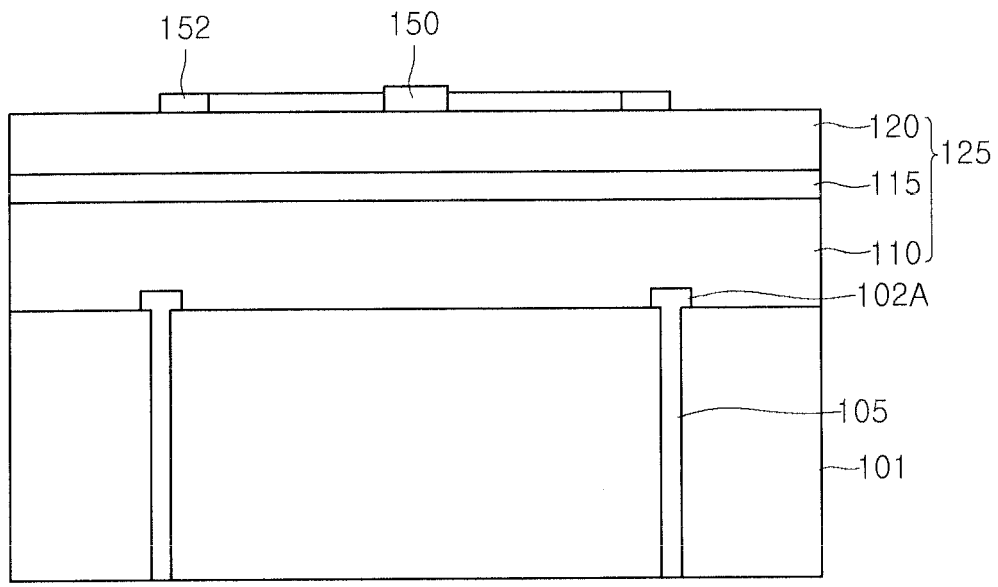

Referring to FIGS. 5 and 6, the reflection layer 102 is removed. A region 102A from which the reflection layer 102 is removed is upper ends of the holes 105 so that the holes 105 are connected to a lower portion of the light emitting structure layer 125, that is, a lower portion of the first conductive type semiconductor layer 110.

The reflection layer 102 may be removed by wet etching. The wet etching may be performed by using an etchant selectively including a hydrofluoric acid (HF), a nitric acid ($HNO_3$), an acetic acid ($CH_3COOH$), a phosphoric acid ($H_3PO_4$), and a sulfuric acid ($H_2SO_4$). The wet etching may be formed by a different manner within the technical scope of the embodiment. If the reflection layer 102 has good conductivity, the reflection layer 102 may not be removed.

Second electrode parts 150 and 152 electrically connected to each other are formed on the topside of the light emitting structure layer 125. The second electrode parts 150 and 152 may be formed after the second conductive type semiconductor layer 120 is formed. The second electrode parts 150 and 152 may be formed before or after the holes 105 are formed. This sequence is a non-limiting example.

The second electrode parts 150 and 152 may be electrically connected to the second conductive type semiconductor layer 120. For example, the second electrode parts 150 and 152 may be formed on the second conductive type semiconductor layer 120. The second electrode parts 150 and 152 may include a pad (150) and a second electrode (152). The second electrode parts 150 and 152 may be formed into a single layer or multi layers by using at least one selected from the group consisting of Ti, Al, Al alloy, In, Ta, Pd, Co, Ni, Si, Ge, Ag, Ag alloy, Au, Hf, Pt, Ru, Au, and an alloy thereof. The second electrode parts 150 and 152 may include at least one pad 150. As shown in FIG. 2, the second electrode 152 is electrically connected to the pad 150. The second electrode 152 may have at least a branch or arm shape. For example, the second electrode 152 may have a loop, line, curve, polygonal, or circular shape. However, the second electrode 152 is not limited thereto.

A second electrode layer may be formed between the second electrode parts 150 and 152 and the second conductive type semiconductor layer 120. The second electrode layer may include a current diffusion layer or a transmittive conductive layer. The second electrode layer may include a transmittive oxide or nitride. For example, the second electrode layer may be formed into a single-layer or multilayer structure by using at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni, Ag, Ni/IrOx/Au, and Ni/IrOx/Au/ITO. The second electrode layer may diffuse a current and supply the diffused current to the second conductive type semiconductor layer 120.

Figure 7:
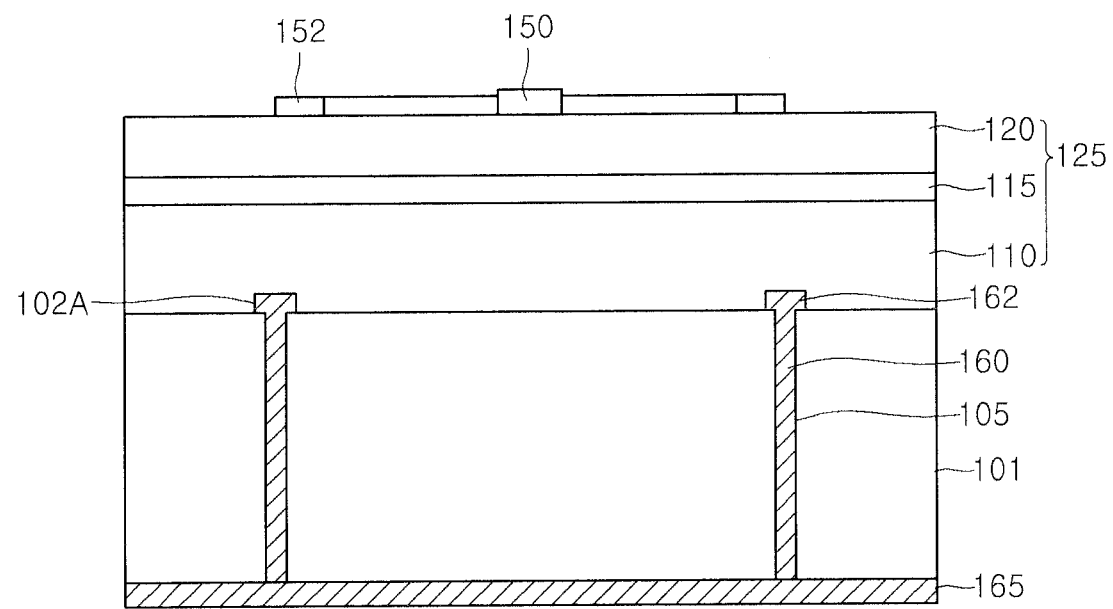

Referring to FIG. 7, first electrodes 160 are formed in the holes 105 of the substrate 101. The first electrodes 160 may be formed by forming metal seeds and performing a plating process. Alternatively, the first electrodes 160 may be formed by filling a conductive material in the holes 105. However, the first electrodes 160 are not limited to such methods.

As many first electrodes 160 as the number of the holes 105 may be formed. The first electrodes 160 may be disposed under a light emitting region of the light emitting device 100, for example, under the active layer 115.

The first electrodes 160 may be formed in the holes 105 vertically formed in the substrate 101 by using a metal including one or more of Cu, Ti, Cr, Ta, Al, In, Pd, Co, Ni, Ge, Ag, and Au, but is not limited thereto.

The first electrodes 160 may be formed into a vertical line shape or non-linear shape to connect the lower side of the first conductive type semiconductor layer 110 and the lower side of the substrate 101. The diameter or width of the first electrodes 160 disposed in the substrate 101 may be about 0.5 µm to about 50 µm. The diameter or width of contact portions 162 of the first electrodes 160 may be in the range from about 2 µm to about 50 µm, and the thickness of the contact portions 162 may be in the range from about 10 Å to about 30000 Å. The contact portions 162 may be upper ends of the first electrodes 160.

At least two of the contact portion 162 of the first electrodes 160 may be connected to each other through a conductive layer that varies according to the pattern of the reflection layer 102.

The diameter of width of the contact portions 162 of the first electrodes 160 may be may be greater than at least that of the first electrodes 160 disposed in the substrate 101, but not limited thereto.

As shown in FIG. 2, the first electrodes 160 may be arranged under a region of the light emitting structure layer 125 at regular, random, or irregular intervals. However, the first electrodes 160 are not limited thereto. The intervals and arrangement of the first electrodes 160 may correspond to current efficiency and the pattern of the second electrode 152 and may be varied according to the pattern of the second electrode 152.

A first electrode layer 165 may be formed under the substrate 101 to connect lower ends of the electrodes 160.

The first electrode layer 165 may be formed of the same material as a first electrode material or a material different from the first electrode material. The first electrode layer 165 may be formed into a single-layer or multilayer structure by using the same metal used to form the first electrodes 160. The first electrode layer 165 may function as a reflection layer or a bonding layer. The first electrode layer 165 may be formed on the lower surface of the substrate 101 entirely or partially and be formed into a single pattern or a plurality of patterns.

The lower surface of the substrate 101 may be treaded by lapping and/or polishing, but not limited thereto.

Thereafter, an isolation etching process may be performed on boundaries (for example, channel regions) between chips.

Then, the chips may be separated from each other by a cutting or/and breaking process. Here, the isolation etching process is performed to separate the chips and may be performed before or after the process of forming electrodes. However, the processes are not limited to this sequence.

Figure 8:
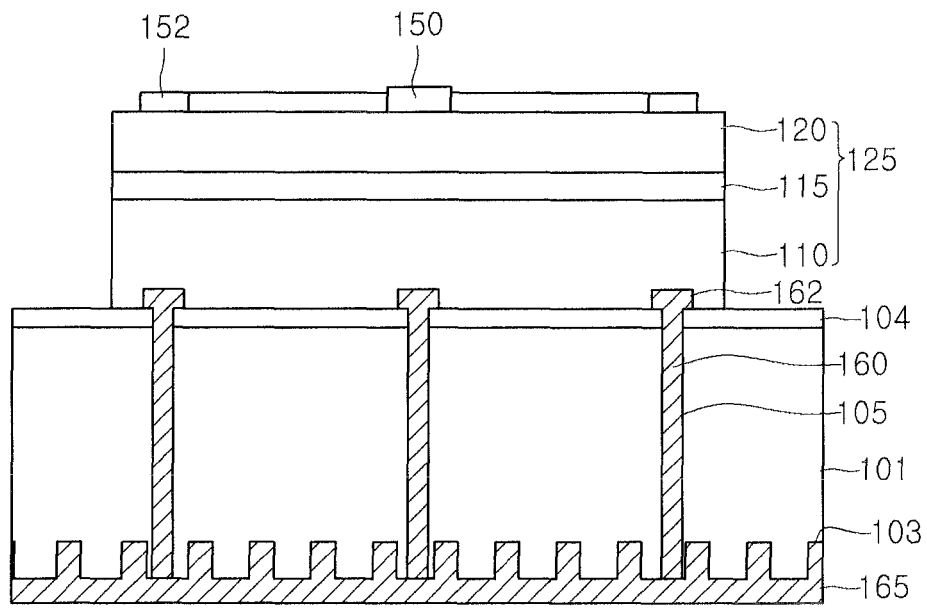
FIG. 8 is a side sectional view illustrating a light emitting device according to a second embodiment.

FIG. 8 is a side sectional view illustrating a light emitting device 100A according to a second embodiment. In the following description of the second embodiment, the same described as that made in the first embodiment will not be repeated.

Referring to FIG. 8, the light emitting device 100A includes a substrate 101 having a concave-convex structure 103, a first semiconductor layer 104, a light emitting structure layer 125, second electrode parts 150 and 152, first electrodes 160, and a first electrode layer 165.

The substrate 101 may be formed of a material selected from the group consisting of $Al_2O_3$ (sapphire), GaN, SiC, ZnO, GaP, InP, $Ga_2O_3$, and GaAs. A concave-convex structure having a lens or stripe shape may be formed on the substrate 101. In addition, a first semiconductor layer 104 may be formed on the substrate 101. The first semiconductor layer 104 may be a layer or pattern formed of a group II to VI compound semiconductor. For example, the first semiconductor layer 104 may include at least one of a ZnO layer (not shown), a buffer layer (not shown), and an undoped semiconductor layer (not shown).

The light emitting structure layer 125 is formed on the first semiconductor layer 104 by using a group III-V compound semiconductor. The light emitting structure layer 125 includes a first conductive type semiconductor layer 110, an active layer 115, and a second conductive type semiconductor layer 120.

The second electrode parts 150 and 152 are electrically connected to the second conductive type semiconductor layer 120. A detailed description thereof will be omitted.

The plurality of first electrodes 160 are disposed in a region under the active layer 115. The first electrodes 160 are vertically disposed in the substrate 101. Contact portions 162 of the first electrodes 160 are disposed in regions where a reflection layer (refer to FIGS. 3 to 6). The reflection layer is formed and removed by etching after the first semiconductor layer 104 is formed.

The diameter or width of the contact portions 162 of the first electrodes 160 may be greater than at least the diameter or width of the first electrodes 160 disposed in the substrate 101, and the diameter or width of the first electrodes 160 disposed in the substrate 101 may be varied according to regions of the substrate 101.

The concave-convex structure 103 is formed at a lower part of the substrate 101. The concave-convex structure 103 includes concave parts and convex parts that are alternatively arranged. Examples of the shape of the concave-convex structure 103 include a concave-convex pattern, a texture pattern, and a rough pattern. The concave-convex structure 103 may be formed by performing a dry etching process and/or a wet etching process on the lower surface of the substrate 101. The concave parts and convex parts of the concave-convex structure 103 may be arranged at regular or irregular intervals and may have a polygonal shape or a spherical shape.

The first electrode layer 165 is disposed on the lower side of the substrate 101 and has a shape corresponding to the shape of the concave-convex structure 103. Therefore, the first electrode layer 165 can reflect light incident on the substrate 101, and a critical angle of light can be varied by the concave-convex structure 103 to improve light extraction efficiency.

Figure 9:
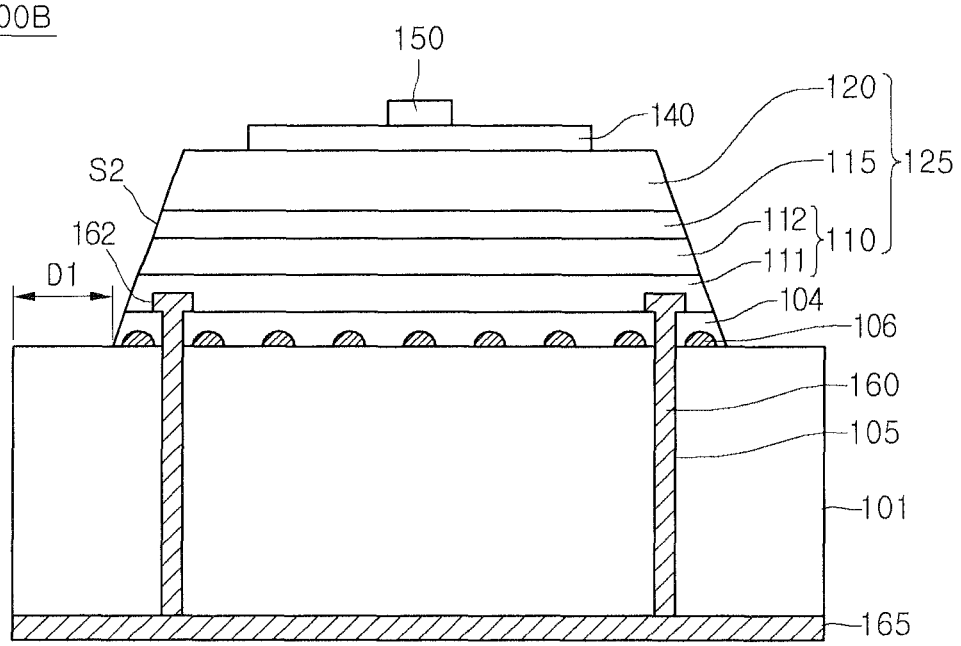
FIG. 9 is a side sectional view illustrating a light emitting device according to a third embodiment.

FIG. 9 is a side sectional view illustrating a light emitting device 100B according to a third embodiment.

Referring to FIG. 9, the light emitting device 100B includes a substrate 101, a first semiconductor layer 104, a light emitting structure layer 125, first electrodes 160, a first electrode layer 165, a second electrode layer 140, and a pad 150.

The substrate 101 may be formed of a material selected from the group consisting of $Al_2O_3$ (sapphire), GaN, SiC, ZnO, Si, GaP, InP, $Ga_2O_3$, and GaAs.

A light extraction structure 106 may be disposed between the substrate 101 and the first semiconductor layer 104. The light extraction structure 106 may be formed by partially etching the topside of the substrate 101 or be formed of an additional material. The light extraction structure 106 includes a light diffusion structure. The light extraction structure 106 may include at least one of a metal dot structure, an insulating dot structure, and a semiconductor dot structure. The light extraction structure 106 may be formed of a material having a refractive index different from that of the first semiconductor layer 104. However, the light extraction structure 106 is not limited thereto.

The light extraction structure 106 may be disposed between a second semiconductor layer 111 and a third semiconductor layer 112 of a first conductive type semiconductor layer 110. The light extraction structure 106 may diffuse a current.

The first semiconductor layer 104 may be a layer or pattern formed of a group II to VI compound semiconductor. For example, the first semiconductor layer 104 may include at least one of a ZnO layer (not shown), a buffer layer (not shown), and an undoped semiconductor layer (not shown).

The first conductive type semiconductor layer 110 includes the second semiconductor layer 111 and the third semiconductor layer 112. The second semiconductor layer 111 and the third semiconductor layer 112 may have different dopant concentrations, thicknesses, or composition formulas. The dopant concentration of the second semiconductor layer 111 may be lower than that of the third semiconductor layer 112. For example, the second semiconductor layer 111 may be a low conductive semiconductor layer, and the third semiconductor layer 112 may be more conductive than the second semiconductor layer 111. The second semiconductor layer 111 may be formed of an AlGaN layer, and the third semiconductor layer 112 may be formed of a GaN layer. A stacked structure of the second semiconductor layer 111 and the third semiconductor layer 112 may be repeated at least twice (two periods), but not limited thereto.

The stacked structure of the second semiconductor layer 111 and the third semiconductor layer 112 may be a super lattice structure (SLS) formed of a material selected from the group consisting of GaN, InN, AlN, InGaN, AlGaN, InAlGaN, $SiO_2$, $SiO_x$, $SiN_2$, $SiN_x$, $SiO_xN_y$, and a metal material. In the super lattice structure, at least two different layers are alternately repeated at least two times (two periods). For example, a stacked structure of InGaN/GaN is repeated. Each layer of the super lattice structure may have a thickness of about several angstroms (Å) or more.

Alternatively, the stacked structure of the second semiconductor layer 111 and the third semiconductor layer 112 may be formed by alternately stacking at least two layers having different refractive indexes so that the stacked layers may function as reflection layers. For example, a structure of GaN layer/AlN layer may be repeatedly stacked at least two periods to form a distributed Bragg reflector (DBR).

Contact portions 162 of the first electrodes 160 may make contact with the second semiconductor layer 111 and/or the third semiconductor layer 112, but are not limited thereto.

The second electrode layer 140 is disposed on the second conductive type semiconductor layer 120. The second electrode layer 140 includes a material different from the semiconductor layers, for example, a conductive material such as a metal oxide or a metal nitride. The second electrode layer 140 may be formed of at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni, Ag, Ni/IrOx/Au, and Ni/IrOx/Au/ITO.

The width of the second electrode layer 140 may be smaller than at least the width of the second conductive type semiconductor layer 120. At least one of the second electrode layer 140 and the second conductive type semiconductor layer 120 may include a rough top surface.

At least one pad 150 is disposed on the second electrode layer 140, and power supplied to the pad 150 may be diffused by the second electrode layer 140. An electrode may be further connected to the pad 150. However, it is a non-limiting example.

The side surfaces of the light emitting structure layer 125 may be oblique to the lower surface of the substrate 101, and the lower surface of the active layer 115 may be smaller than the lower surface of the first conductive type semiconductor layer 110. In addition, the first electrodes 160 may be disposed in a region under the active layer 115 or the first conductive type semiconductor layer 110.

Figure 10:
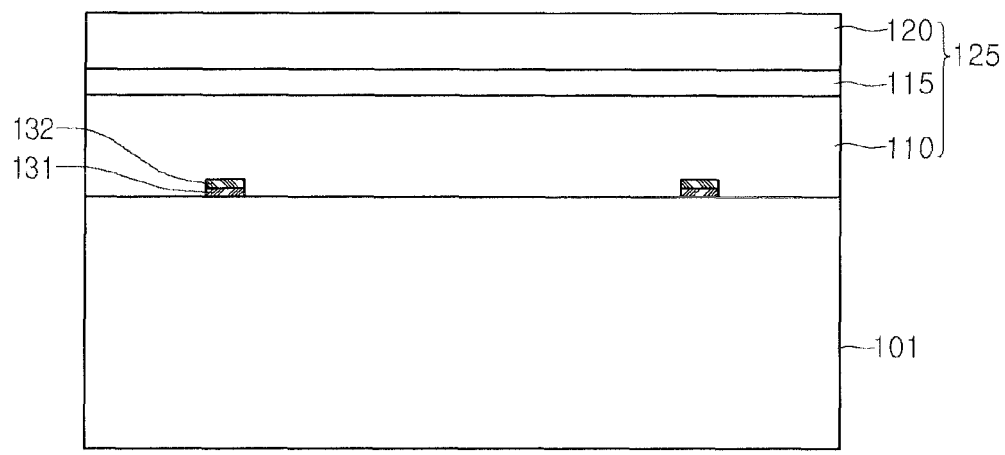
FIGS. 10 and 11 are views for explaining processed of manufacturing a light emitting device according to a fourth embodiment.
Figure 11:
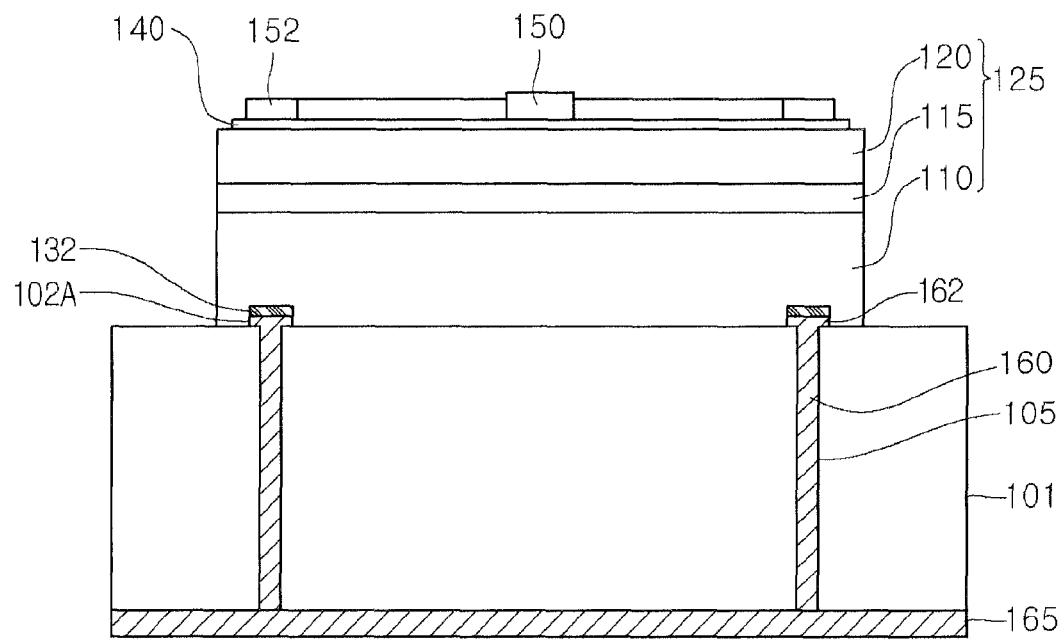

FIGS. 10 and 11 are views for explaining processed of manufacturing a light emitting device according to a fourth embodiment. FIG. 10 is view for explaining elements modified from those explained with reference to FIGS. 3 and 4. Descriptions of other processes are the same as those explained with reference to FIGS. 3 to 7.

Referring to FIG. 10, a first layer 131 and a second layer 131 are disposed between a substrate 101 and a first conductive type semiconductor layer 110. The second layer 131 may receive laser light and function as an absorption layer. The second layer 132 may function as a reflection layer to reflect laser light. The first layer 131 functioning as an absorption layer may include at least one selected from the group consisting of ZnO, $TiO_2$, $SiO_2$, $Si_3N_4$, TIN, AlN, GaN, W, Ta, and Mo. The second layer 132 may include a material (oxide-based or nitride-based) or a structure such as a GaN/AlGaN super lattice structure, W, Mo, a W/Mo structure, a Si/Mo super lattice structure, and a Mo/Si super lattice structure. The first layer 131 may be formed of a metal having a high melting point. For example, the first layer 131 may be formed of at least one metal selected from the group consisting of W and Mo. In addition, the first layer 102 has a structure of Omni-Directional Reflective (ODR) using at least metal layer such as Ti, Ta, W, Mo and alloy thereof.

The reflectivity of the first layer 131 may be 50% or higher for a given laser source, but is not limited thereto. In another example, the first layer 131 and the second layer 132 may have different widths. For example, a width of the second layer 132 may be wider than the first layer 131.

Referring to FIG. 11, holes are formed in the substrate 101 using a laser, and the first layer 131 is removed by wet etching. Contact portions 162 of first electrodes 160 may be formed in regions 102A from which the first layer 131 is removed. The contact portions 162 of the first electrodes 160 may be disposed under the second layer 132 and make contact with the first conductive type semiconductor layer 110. The second layer 132 is less conductive than the first conductive type semiconductor layer 110 so that a current from the contact portions 162 of the first electrodes 160 is blocked by the second layer 132. Thus, a current from the contact portions 162 of the first electrodes 160 can be diffused in the first conductive type semiconductor layer 110 by the second layer 132. In another example, if the width of the second layer 132 is greater than the width of the first layer 131, the width of the second layer 132 may be adjusted be smaller than the width of the contact portions 162 of the first electrodes 160 to improve current diffusion efficiency.

Figure 12:
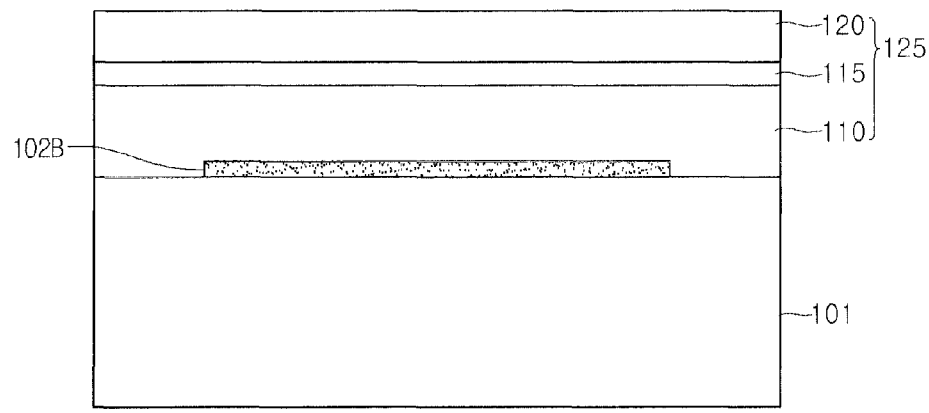
FIGS. 12 to 14 are views for explaining processes of manufacturing a light emitting device according to a fifth embodiment.
Figure 13:
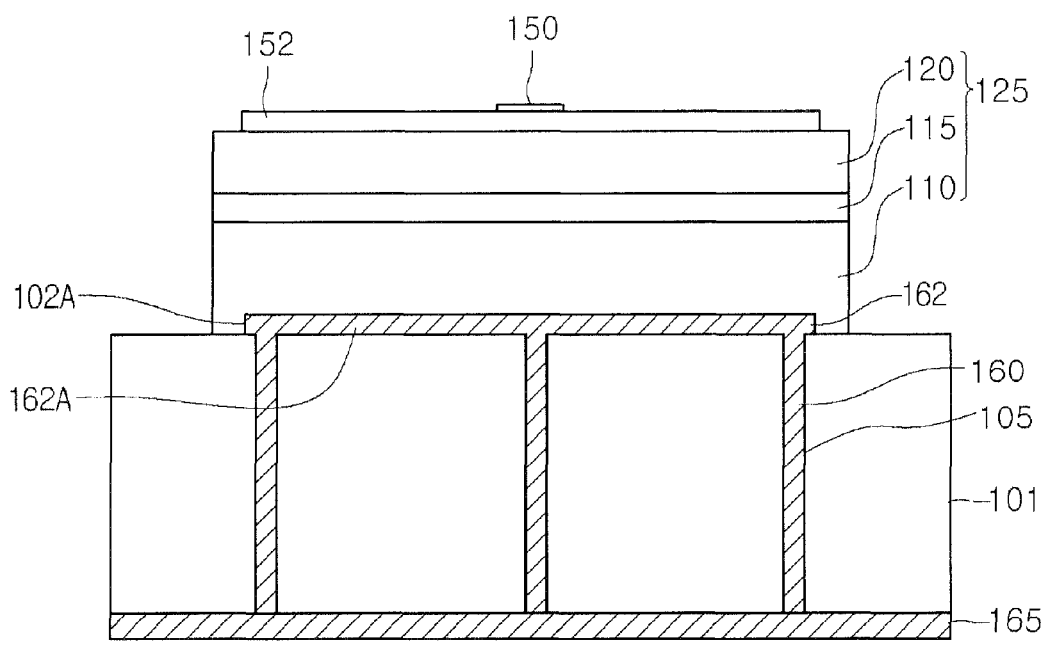
Figure 14:
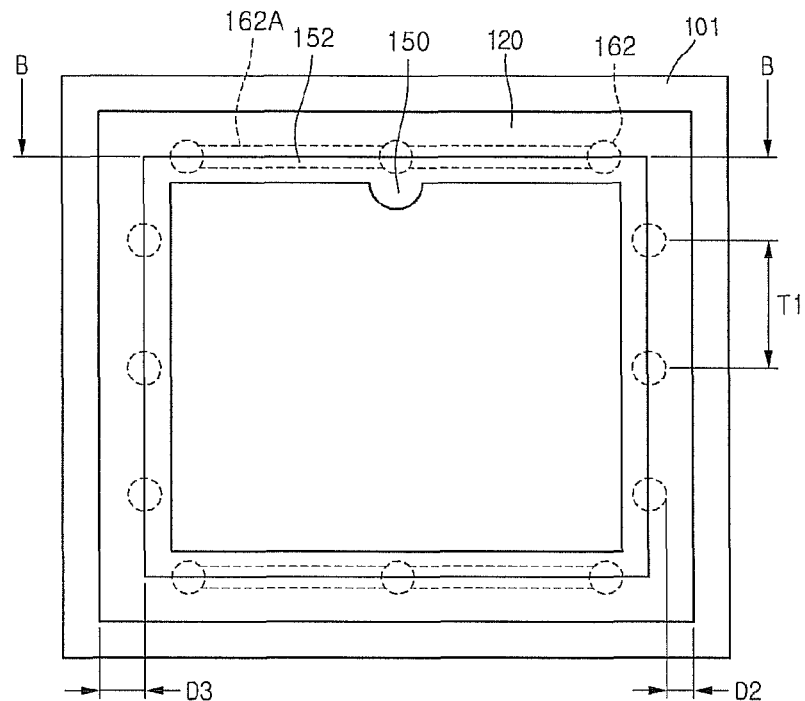

FIGS. 12 to 14 are views for explaining processes of manufacturing a light emitting device according to a fifth embodiment.

Referring to FIG. 12, an absorption layer 102B is formed on a substrate 101 or under a first conductive type semiconductor layer 110. The length of the absorption layer 102B may be about ½ to about ⅕ the width of a light emitting structure layer. The length of the absorption layer 102B may be enough to connect at least two second electrodes. The absorption layer 102B may have only an absorption function or be formed into an absorption layer/reflection layer stacked structure. However, the absorption layer 102B is not limited thereto.

Referring to FIGS. 13 and 14, holes 105 are formed in the substrate 101 at positions under the absorption layer 102B, and the absorption layer 102B is removed. The absorption layer 102B may be removed by a wet etching process. In this case, a part of the absorption layer 102B may not be removed by the wet etching process.

First electrodes 160 are filled in the holes 105 so that contact portions 162 of the first electrodes 160 can make contact with the first conductive type semiconductor layer 110. The contact portions 162 of the first electrodes 160 may include bridge portions 162A connecting the contact portions 162.

As shown in FIG. 4, the bridge portions 162A are a conductive layer connecting the plurality of first electrodes 160. The number of the bridge portions 162A is at least two, and the bridge portions 162A may connect first electrodes 160 disposed in different regions. FIG. 13 is a side sectional view taken along line B-B of FIG. 14.

Figure 15:
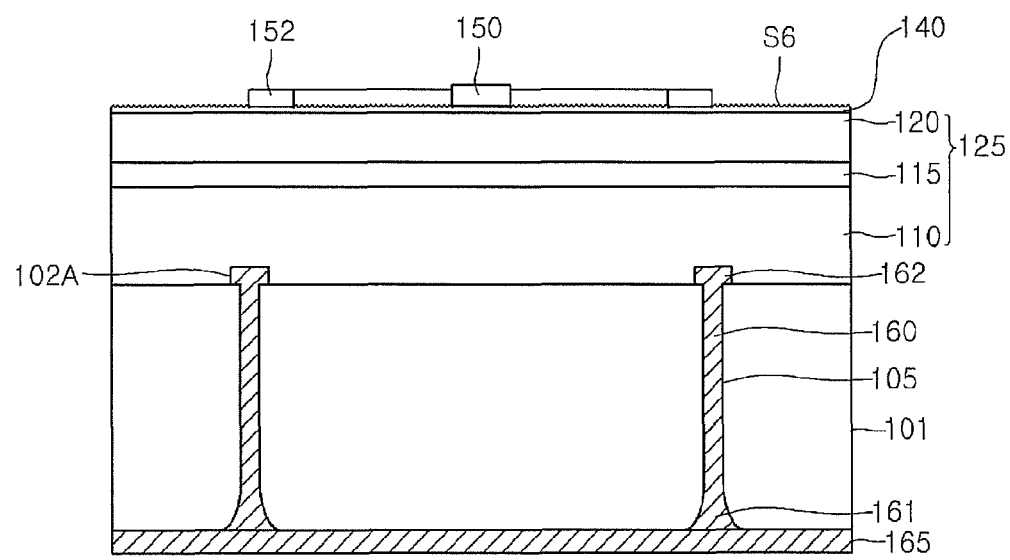
FIG. 15 is a view illustrating a light emitting device according to a sixth embodiment.

FIG. 15 is a side sectional view illustrating a light emitting device according to a sixth embodiment.

Referring to FIG. 15, the width of lower portions 161 of first electrodes 160 is greater than the width of center parts of the first electrodes 160. The lower portions 161 of the first electrodes 160 are second contact portions, and contact portions 162 of the first electrodes 160 are first contact portions. The lower portions 161 of the first electrodes 160 become wider as it goes down in a substrate 101 so that contact areas between the lower portions 161 and a first electrode layer 165 can be increased for improving electrical reliability.

A second electrode layer 140 is formed on a second conductive type semiconductor layer 120. The second electrode layer 140 includes a transmittive oxide or a transmittive nitride and is conductive.

The second electrode layer 140 may include a rough surface as a light extraction structure S6 having a regular or irregular concave-convex structure. The light extraction structure S6 of the second electrode layer 140 may vary a critical angle of incident light to improve light extraction efficiency.

The second electrode layer 140 may make contact with the lower sides of second electrode parts 150 and 152 to diffuse a current.

Figure 16:
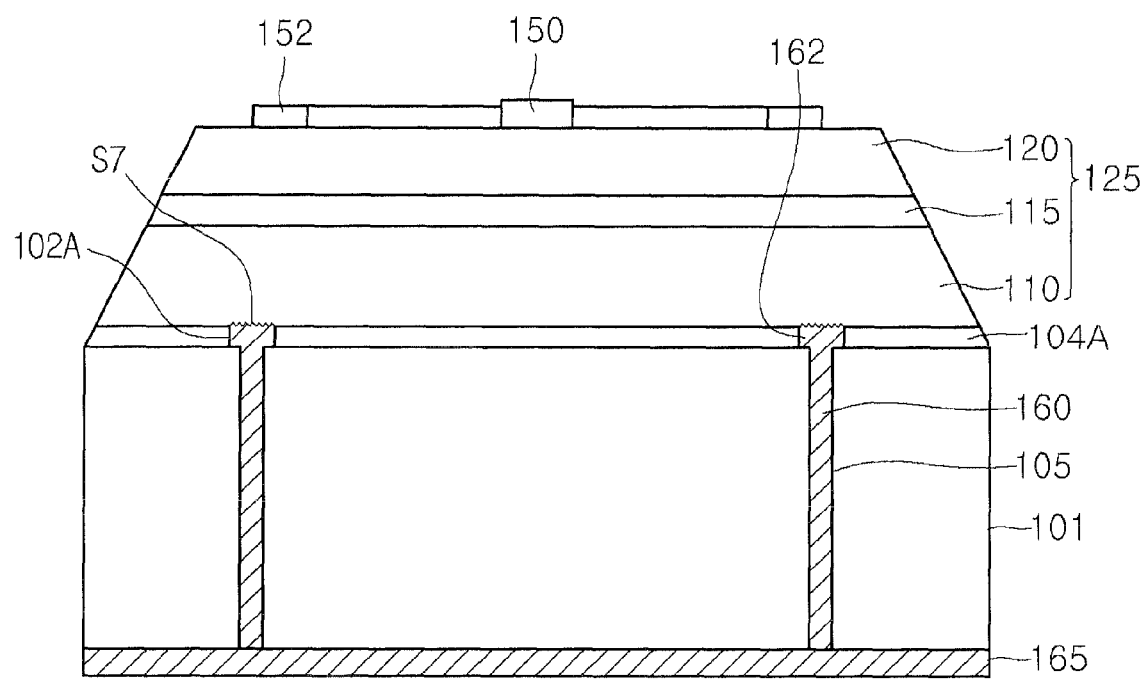
FIG. 16 is a side sectional view illustrating a light emitting device according to a seventh embodiment.

FIG. 16 is a side sectional view illustrating a light emitting device according to a seventh embodiment.

Referring to FIG. 16, in the light emitting device, contact portions 162 of first electrodes 160 may include rough surfaces. The top surfaces of the contact portions 162 may make contact with rough surfaces S7 of a first conductive type semiconductor layer 110. Owing to the rough surfaces S7, light extraction efficiency and current injection efficiency may be improved.

The rough surfaces S7 are formed on the lower surface of the first conductive type semiconductor layer 110 by performing a wet etching process on such a structure as shown in FIGS. 5 and 6. The lower surface of the first conductive type semiconductor layer 110 is an N-face having a surface roughness greater than that of a Ga-face. Owing to the rough surfaces S7, current injection efficiency and light extraction efficiency can be improved.

The thickness of a first semiconductor layer 104A may be smaller than that of an absorption layer, and the contact portions 162 of the first electrodes 160 may be disposed in the first semiconductor layer 104A. According to the thicknesses of the first semiconductor layer 104A and the absorption layer, contact positions of the contact portions 162 of the first electrodes 160 may be varied.

Figure 17:
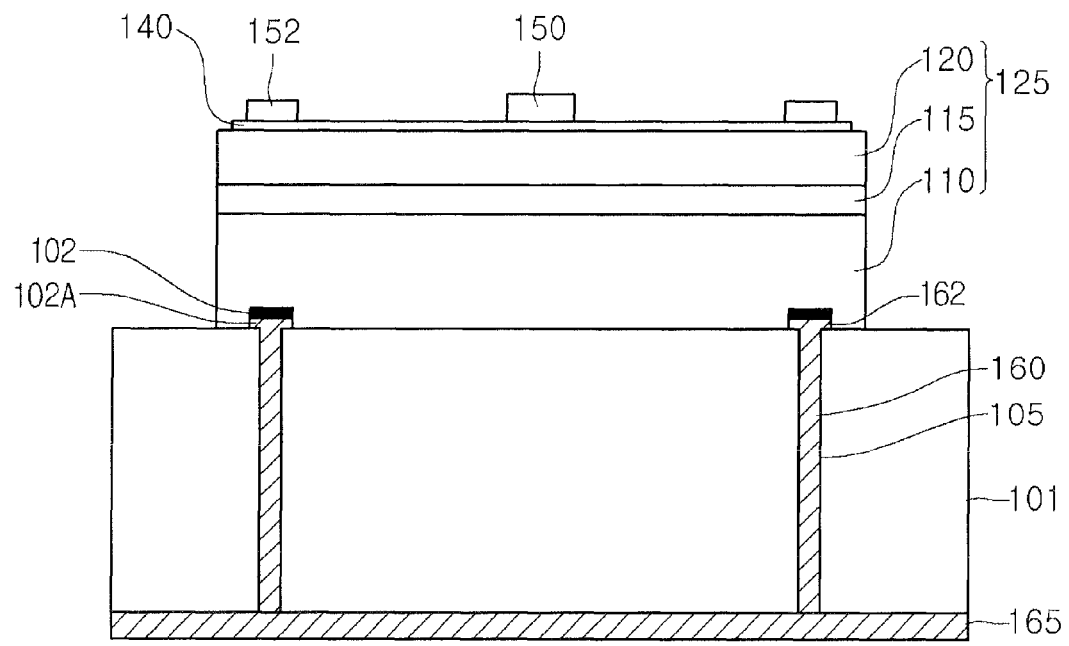
FIG. 17 is a side sectional view illustrating a light emitting device according to an eighth embodiment.

FIG. 17 is a side sectional view illustrating a light emitting device according to an eighth embodiment.

Referring to FIG. 17, an absorption layer 102 of the light emitting device is partially removed by an etching process, and thus parts of the absorption layer 102 are left. Contact portions 162 of first electrodes 160 are disposed under the absorption layer 102 and make contact with inner sides of a first conductive type semiconductor layer 110. In this way, since the contact portions 162 of the first electrodes 160 make contact with the absorption layer 102 and the first conductive type semiconductor layer 110, a current can be diffused. The width of the absorption layer 102 may be different from the width of the contact portions 162 of the first electrodes 160. For example, the width of the contact portions 162 of the first electrodes 160 may be greater than the width of the absorption layer 102.

A second electrode layer 140 is disposed on a second conductive type semiconductor layer 120, and the width of the second electrode layer 140 is smaller than at least the width of the second conductive type semiconductor layer 120.

Figure 18:
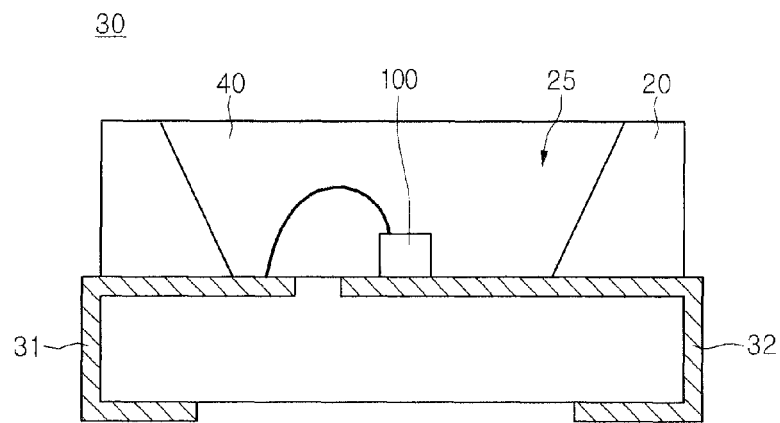
FIG. 18 is a view illustrating a light emitting device package according to an embodiment.

FIG. 18 is a view illustrating a light emitting device package 30 according to an embodiment.

Referring to FIG. 18, the light emitting device package 30 includes: a body 20; first and second lead electrodes 31 and 32 disposed on the body 20; the light emitting device 100 of the previous embodiment disposed on the body 20 and electrically connected to the first and second lead electrodes 31 and 32; and a molding member 40 enclosing the light emitting device 100.

The body 20 may be formed of a material such as silicon, synthetic resin, and metal. A cavity 25 may be formed in an upper part of the body 20. The topside of the cavity 25 may be opened, and the first and second lead electrodes 31 and 32 may be disposed on the bottom side of the cavity 25. Lateral surfaces of the cavity 25 may be oblique or vertical to the lower surface of the cavity 25, but are not limited thereto. The cavity 25 of the body 20 may have a stepped structure. Alternatively, the body 20 may not include the cavity 25 and have a flat top surface.

The first and second lead electrodes 31 and 32 are electrically separated from each other and are configured to supply power to the light emitting device 100. In addition, the first and second lead electrodes 31 and 32 may be formed of a metal plate such as a lead frame, but are not limited thereto. The first and second lead electrodes 31 and 32 may reflect light emitted from the light emitting device 100 to improve optical efficiency and may dissipate heat generated from the light emitting device 100.

The light emitting device 100 may be disposed on the body 20 or on the first or second lead electrodes 31 or 32.

The light emitting device 100 may be electrically connected to the first lead electrode 31 through a wire and to the second lead electrode 32 by die bonding.

The molding member 40 may include silicon or a resin such as epoxy. The molding member 40 may be disposed in the cavity 25. The molding member 40 may cover the light emitting device 100 to protect the light emitting device 100. In addition, a phosphor may be contained in the molding member 40 to change the wavelength of light emitted from the light emitting device 100.

<Lighting System>

The semiconductor light emitting device or a light emitting device package according to an embodiment may be provided in plurality. The plurality of light emitting devices or the light emitting device packages may be arrayed on the board. Optical members such as a light guide plate, a prism sheet, and a diffusion sheet may be disposed on a path of the light emitted from the light emitting device. The light emitting device package, the board, and the optical members may serve as a lighting unit. The lighting unit may be manufactured in a top view type or a side view type. Thus, the lighting unit may be provided as display devices for a portable terminal, a notebook computer, etc, or variously applied to the lighting device, the indicating device, etc. Also, in another embodiment, the lighting unit may be realized as a lighting system including the light emitting device or the light emitting device package according to the above-described embodiments. The lighting system may include display devices illustrated in FIGS. 19 and 20, a lighting device illustrated in FIG. 21, illumination lamps, signal lights, car headlights, electronic displays, and the like.

Figure 19:
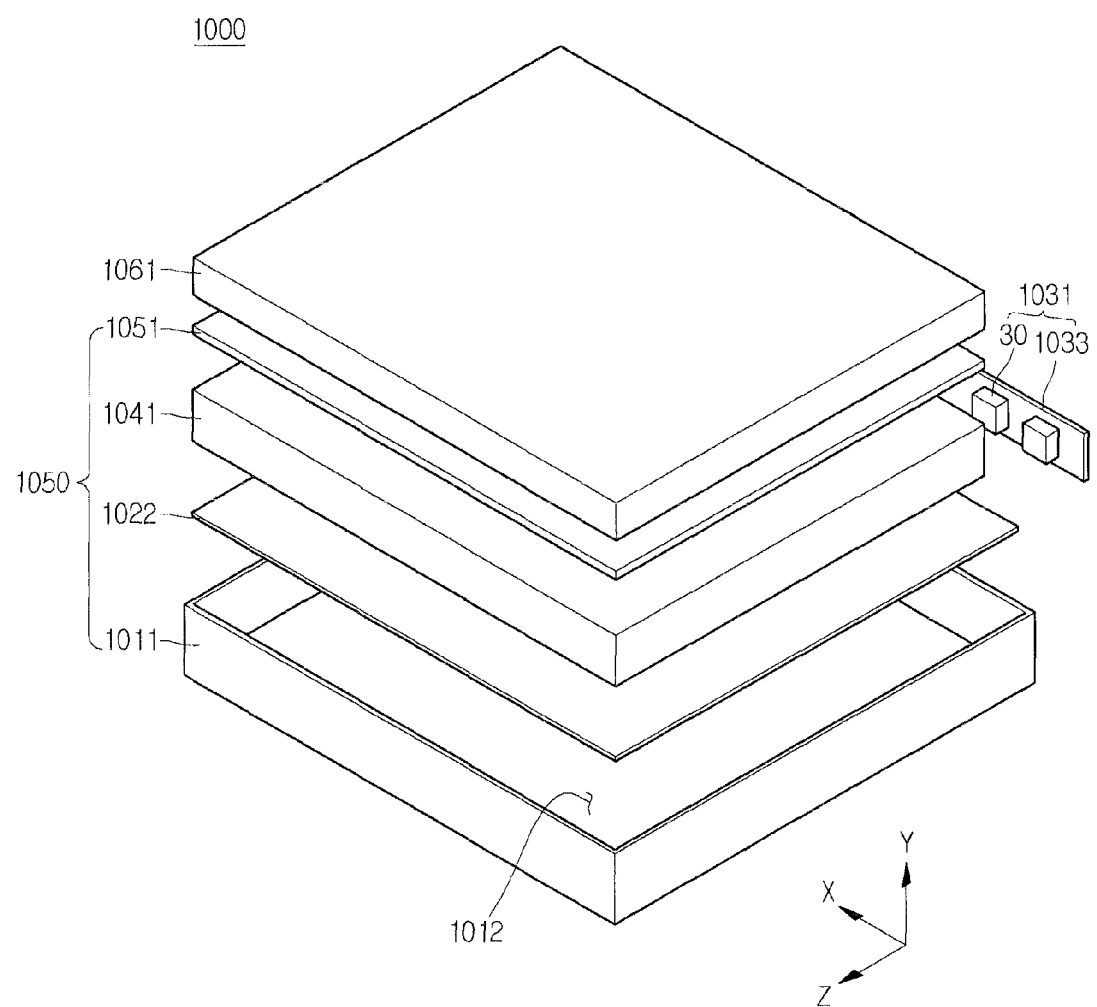
FIG. 19 is a diagram illustrating a display device according to an embodiment.

FIG. 19 is an exploded perspective view illustrating a display device according to an embodiment.

Referring to FIG. 19, a display device 1000 according to the embodiment may include a light guide plate 1041, a light emitting module 1031 providing light to the light guide plate 1041, a reflection member 1022 under the light guide plate 1041, an optical sheet 1051 on the light guide plate 1041, a display panel 1061 on the optical sheet 1051, and a bottom cover 1011 storing the light guide 1041, the light emitting module 1031, and the reflection member 1022; however, it is not limited to this.

The bottom cover 1011, the reflection sheet 1022, the light guide plate 1041, and the optical sheet 1051 may be defined as a light unit 1050.

The light guide plate 1041 serves to diffuse light for convergence to a surface light source. The light guide plate 1041 is formed with transmittive material and, e.g., may include one of acrylic resin such as polymethyl metaacrylate (PMMA), polyethylene terephthlate (PET), poly carbonate (PC), cycloolefin copolymer (COC), and polyethylene naphthalate (PEN) resins.

The light emitting module 1031 provides light to at least one side of the light guide plate 1041 and ultimately acts as a light source of the display device.

At least one light emitting module 1031 is included, and it may provide light directly or indirectly at one side of the light guide plate 1041. The light emitting module 1031 includes a board 1033 and the light emitting device package 30 according to the above-disclosed embodiment. The light emitting device package 30 may be arrayed at predetermined intervals on the board 1033.

The board 1033 may be a Printed Circuit Board (PCB) including a circuit pattern (not illustrated). However, the board 1033 may include not only the typical PCB but also a metal core PCB (MCPCB) and a flexible PCB (FPCB), and it is not limited to this. In the case that the light emitting device package 30 is installed on the side of the bottom cover 1011 or on a heat radiating plate, the board 1033 may be eliminated. Herein, a part of the heat radiating plate may be contacted to an upper surface of the bottom cover 1011.

The plurality of light emitting device packages 30 may be installed on the board 1033 so that a light-emitting surface is separated from the light guide plate 1041 by a predetermined distance, and there is no limit for this. The light emitting device package 30 may provide light to a light-entering part, i.e., one side, of the light guide plate 1041 directly or indirectly, and there is no limit for this.

The reflection member 1022 may be disposed under the light guide plate 1041. The reflection member 1022 reflects the light incident to the lower surface of the light guide plate 1041 in an upward direction so that brightness of the light unit 1050 may be improved. The reflection member 1022 may be formed with, e.g., PET (Polyethylene terephthalate), PC, PVC (polyvinyl chloride) resins; however, it is not limited to this. The reflection member 1022 may be the upper surface of the bottom cover 1011; however, there is no limit for this.

The bottom cover 1011 may store the light guide plate 1041, the light emitting module 1031, and the reflection member 1022. To this end, the bottom cover 1011 may be provided with a storing unit 1012 having a shape of a box whose upper surface is open, and there is not limit for this. The bottom cover 1011 may be combined with a top cover, and there is no limit for this.

The bottom cover 1011 may be formed with metal material or resin material and may be fabricated using processes of press or extrusion molding. The bottom cover 1011 may also include metal or non-metal material having good thermal conductivity, and there is no limit for this.

The display panel 1061 is, e.g., an LCD panel, and includes transmittive first and second substrates, and a liquid crystal layer between the first and second substrates. On at least one side of the display panel 1061, a polarizing plate may be attached; however, the attaching structure is not limited to this. The display panel 1061 displays information by the light which passes through the optical sheet 1051. The display device 1000 may be applied to various cell phones, monitors of notebook computers, monitors of laptop computers, and televisions.

The optical sheet 1051 is disposed between the display panel 1061 and the light guide plate 1041 and includes at least one translucent sheet. The optical sheet 1051 may include at least one of, e.g., diffusion sheet, horizontal and vertical prism sheets, and brightness enhancement sheet. The diffusion sheet diffuses the incident light. The horizontal or/and vertical prism sheet concentrates the incident light to a display region. The brightness enhancement sheet reuses lost light to enhance brightness. A protection sheet may be disposed on the display panel 1061, and there is no limit for this.

Herein, on the light path of the light emitting module 1031, the light guide plate 1041 and the optical sheet 1051 may be included as optical members; however, there is no limit for this.

Figure 20:
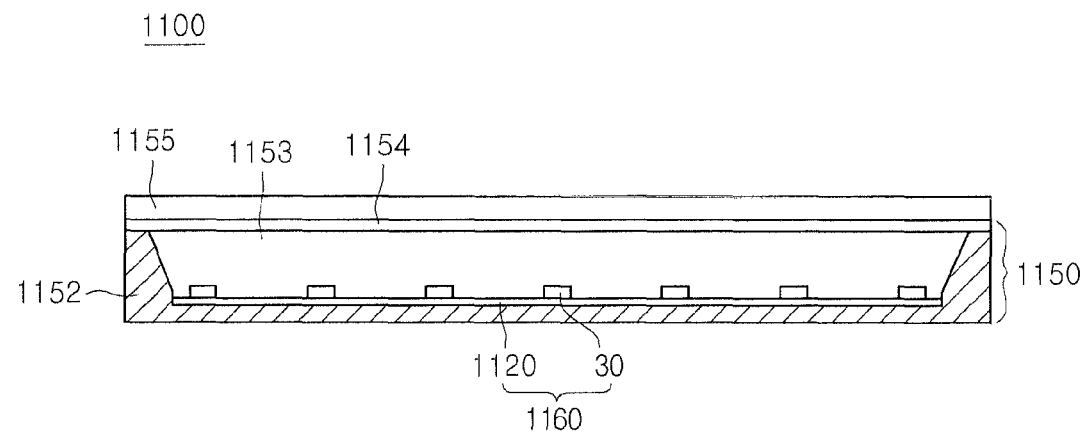
FIG. 20 is a diagram illustrating another display device according to an embodiment.

FIG. 20 is a diagram illustrating a display device according to an embodiment.

Referring to FIG. 20, a display device 1100 includes a bottom cover 1152, a board 1120, an optical member 1154, and a display panel 1155. Herein, the above-disclosed light emitting device packages 30 are arrayed on the board 1120.

The board 1120 and the light emitting device package 30 may be defined as a light emitting module 1060. The bottom cover 1152, at least one light emitting module 1060, and the optical member 1154 may be defined as a light unit.

The bottom cover 1152 may be provided with a storing unit 1153, and there is no limit for this.

Herein, the optical member 1154 may includes at least one of the lens, light guide plate, diffusion sheet, horizontal and vertical prism sheets, and brightness enhancement sheet. The light guide plate may be formed with PC material or polymethyl metaacrylate (PMMA) material, and this light guide plate may be eliminated. The diffusion sheet diffuses the incident light. The horizontal or/and vertical prism sheet concentrates the incident light to the display region. The brightness enhancement sheet reuses lost light to enhance brightness.

The optical member 1154 is disposed on the light emitting module 1060. The optical member 1154 converts the light emitted from the light emitting module 1060 to the surface light source, or performs diffusing and concentrating light.

Figure 21:
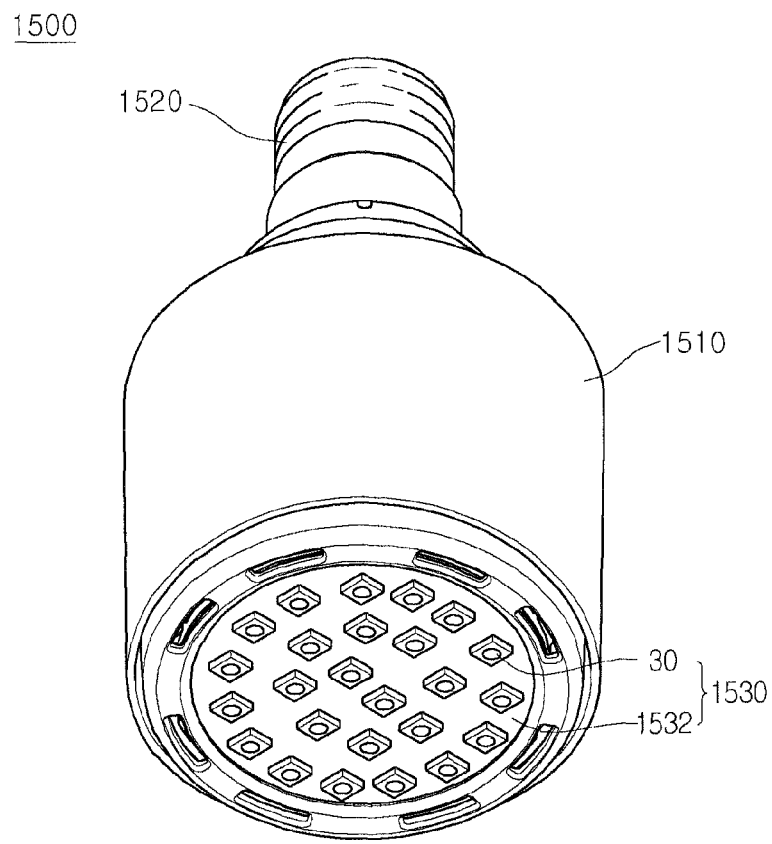
FIG. 21 is a diagram illustrating a lighting device according to an embodiment.

FIG. 21 is a perspective view illustrating an lighting device according to an embodiment.

Referring to FIG. 21, an illumination device 1500 may include a case 1510, a light emitting module 1530 installed to the case 1510, and a connection terminal 1520 installed to the case 1510 and provided with power from an external power source.

It is preferable to form the case 1510 with material which has good heat radiation characteristics. For instance, the case 1510 may be formed with metal material or resin material.

The light emitting module 1530 may include a board 1532 and the light emitting device package 30 according to the embodiment installed on the board 1532. The plurality of light emitting device packages 30 may be arrayed in a matrix form or may be arrayed being separated from each other at predetermined intervals.

The board 1532 may be an insulator where a circuit pattern is printed. For instance, the board 1532 may include the PCB, metal core PCB, flexible PCB, ceramic PCB, and FR-4 board.

The board 1532 may also be formed with material which efficiently reflects light, or its surface may be coated with color, e.g., white and silver, which efficiently reflects light.

At least one light emitting device package 30 may be installed on the board 1532. Each of the light emitting device packages 30 may include at least one Light Emitting Diode (LED) chip. The LED chip may include a light emitting diode of visible light such as red, green, blue, or white or a UV light emitting diode which emits Ultra Violet (UV).

A combination of various light emitting device packages 30 may be disposed in the light emitting module 1530 for obtaining color tone and brightness. For instance, for securing high Color Rendering Index (CRI), a white light emitting diode, a red light emitting diode, and a green light emitting diode may be combined and disposed.

The connection terminal 1520 may be electrically connected to the light emitting module 1530 to supply power. The connection terminal 1520 is screwed to be connected to the external power source in a socket method; however, there is no limit for this. For instance, the connection terminal 1520 may be formed as a pin shape to be inserted into the external power source or may be connected to the external power source by a wire.

According to an embodiment, there is provided a method of manufacturing a light emitting device. The method includes: forming a plurality of first layers on a substrate at predetermined intervals; forming a plurality of compound semiconductor layers on the substrate, the compound semiconductor layers including a first conductive type semiconductor layer, an active layer, and a second conductive type semiconductor layer; forming a plurality of holes in the substrate to expose the first layers; forming first electrodes in the holes; and forming a first electrode layer at a bottom side of the substrate to connect a plurality of lower ends of the first electrodes.

According to the embodiments, an additional region is not necessary for forming a pad used to supply power to the first conductive type semiconductor layer, light emitting area and optical efficiency can be increased as compared with an LED chip having a horizontal electrode structure. Therefore, the light emitting device, the light emitting device package, and the lighting system of the embodiments may have improved reliability.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a substrate;
a light emitting structure layer comprising a first conductive type semiconductor layer, an active layer on the first conductive type semiconductor layer, and a second conductive type semiconductor layer on the active layer;
a second electrode on a top surface of the light emitting structure layer;
a plurality of first electrodes disposed in the substrate and extended from a lower part of the substrate to a lower part of the first conductive type semiconductor layer, the plurality of first electrodes being disposed under a region of the active layer;
a plurality of contact portions having a width greater than a width of each of the plurality of first electrodes disposed in the substrate and disposed at the lower part of the first conductive type semiconductor layer; and
a first electrode layer disposed under the substrate and coupled to the plurality of first electrodes, wherein the first electrode layer includes a reflection layer and wherein a bottom surface of the substrate has a width greater than a width of a bottom surface of the first conductive type semiconductor layer in a first direction,
wherein a bottom surface of the first electrode layer has a width wider than a width of the top surface of the light emitting structure layer in the same first direction,
wherein a top surface of the substrate has an area greater than an area of the bottom surface of the first conducive type semiconductor layer, and
wherein each of the plurality of first electrodes are overlapped with different regions of the second electrode in a second direction, the second direction being a vertical direction and perpendicular to the first direction,
wherein each of the plurality of first electrodes are provided closer to an edge part of the substrate than to a center region of the substrate,
wherein the first electrode layer includes a first region, a second region and a third region which are vertically overlapped with the substrate,
wherein the first region is not vertically overlapped with the light emitting structure layer,
wherein the second region is not vertically overlapped with the light emitting structure layer,
wherein the third region is not vertically overlapped with the light emitting structure layer, and
wherein the first region is disposed between the second region and the third region.

2. The light emitting device according to claim 1, further comprising a reflection layer between each of the plurality of contact portions and the first conductive type semiconductor layer and including a different material from a material of the first conductive type semiconductor layer.

3. A light emitting device comprising:
a transmissive substrate;
a first electrode layer under the substrate;
a light emitting structure layer comprising a first conductive type semiconductor layer, an active layer on the first conductive type semiconductor layer, and a second conductive type semiconductor layer on the active layer;
a plurality of first electrodes disposed in the substrate and extended from the first electrode layer to a lower part of the first conductive type semiconductor layer;
a second electrode layer on a top surface of the light emitting structure layer;
a second electrode on a top surface of the second electrode layer; and
a plurality of contact portions in contact with the lower part of the first conductive type semiconductor layer and having a width different from a width of each first electrode of the plurality of first electrodes disposed in the substrate, wherein:
the first electrode layer includes a reflection layer,
a bottom surface of the substrate has a width greater than a width of a bottom surface of the first conductive type semiconductor layer in a first direction,
the plurality of contact portions are closer to an edge of the first conductive type semiconductor layer than to a center of the first conductive type semiconductor layer,
the second electrode is closer to an edge region of the second conductive type semiconductor layer than to a center region of the second conductive type semiconductor layer, and the second electrode has a loop shape,
wherein the first electrode layer has a width wider than a width of the top surface of the light emitting structure layer in the first direction,
wherein a top surface of the substrate has an area greater than an area of the bottom surface of the first conductive type semiconductor layer, and wherein each of the plurality of first electrodes are overlapped with different regions of the second electrode in a second direction, the second direction being a vertical direction and perpendicular to the first direction, and wherein each of the plurality of first electrodes are provided closer to an edge part of the substrate than to a center region of the substrate in the first direction.

4. The light emitting device according to claim 3, wherein the light emitting device further comprises a reflection layer between the contact portions and the first conductive type semiconductor layer.

5. The light emitting device according to claim 2, wherein the reflection layer is formed of a metal material.

6. The light emitting device according to claim 2, wherein the reflection layer includes at least one of a tungsten (W) material and a molybdenum (Mo) material.

7. The light emitting device according to claim 1, wherein the plurality of contact portions are closer to an edge of the first conductive type semiconductor layer than to a center of the first conductive type semiconductor layer, wherein each of the plurality of contact portions is overlapped with the different regions of the second electrode.

8. The light emitting device according to claim 1, further comprising:

a pad connected to the second electrode and a second electrode layer disposed between the second electrode and the light emitting structure layer, wherein the second electrode and the second electrode layer are disposed on the top surface of the light emitting structure layer and wherein the second electrode is branched from the pad in a loop shape.

9. The light emitting device according to claim 7, wherein the second electrode is closer to an edge region of the second conductive type semiconductor layer than to a center region of the second conductive type semiconductor layer.

10. The light emitting device according to claim 7, wherein each of the plurality of first electrodes in the substrate has a width in a range of about 0.5 μm to about 50 μm.

11. The light emitting device according to claim 2, wherein the reflection layer has a W/Mo stacked structure.

12. The light emitting device according to claim 2, wherein the reflection layer includes a multilayer structure stacked a different metal from each other.

13. The light emitting device according to claim 1, wherein the plurality of contact portions are each covered by a layer having less conductivity than a conductivity of the first conductive type semiconductor layer, wherein the plurality of contact portions are vertically overlapped with the different regions of the second electrode.

14. The light emitting device according to claim 1, wherein the substrate includes a first part, a second part and a third part, wherein the first part is vertically overlapped with the light emitting structure layer and the first region of the first electrode layer, wherein the second part is not vertically overlapped with the light emitting structure layer and is vertically overlapped with the second region of the first electrode layer, wherein the third part is not vertically overlapped with the light emitting structure layer and is vertically overlapped with the third region of the first electrode layer, and wherein the first part is disposed between the second part and the third part.

15. The light emitting device according to claim 1, wherein the bottom surface of the first conductive type semiconductor layer and the plurality of contact portions directly contact a top surface of the substrate.

16. The light emitting device according to claim 3, wherein all of the contact portions are overlapped with the different regions of the second electrode in the vertical direction and are disposed to be closer to the edge of the first conductive type semiconductor layer than to a center region of the second conductive type semiconductor layer.

17. The light emitting device according to claim 3, wherein the substrate includes a first part, a second part and a third part, wherein the first part is vertically overlapped with the light emitting structure layer, wherein the second part is not vertically overlapped with the light emitting structure layer, wherein the third part is not vertically overlapped with the light emitting structure layer, wherein the first part is disposed between the second part and the third part, wherein the first electrode layer includes a first region, a second region and a third region, wherein the first region is vertically overlapped with the light emitting structure layer and the first part of the substrate, wherein the second region is not vertically overlapped with the light emitting structure layer and is vertically overlapped with the second part of the substrate, wherein the third region is not vertically overlapped with the light emitting structure layer and is vertically overlapped with the third part of the substrate, and wherein the first region is disposed between the second region and the third region.

18. The light emitting device according to claim 1, further comprising a second electrode layer between the second electrode and the second conductive type semiconductor layer.

19. The light emitting device according to claim 18, wherein the second electrode layer includes a metal oxide or a metal nitride.

20. A light emitting device comprising:

a substrate;

a light emitting structure layer comprising a first conductive type semiconductor layer, an active layer on the first conductive type semiconductor layer, and a second conductive type semiconductor layer on the active layer;

a second electrode on a top surface of the light emitting structure layer;

a plurality of first electrodes disposed in the substrate and extended from a lower part of the substrate to a lower part of the first conductive type semiconductor layer, the plurality of first electrodes being disposed under a region of the active layer;

a plurality of contact portions having a width greater than a width of each of the plurality of first electrodes disposed in the substrate and disposed at the lower part of the first conductive type semiconductor layer; and a first electrode layer disposed under the substrate and coupled to the plurality of first electrodes, wherein the first electrode layer includes a reflection layer and wherein a bottom surface of the substrate has a width greater than a width of a bottom surface of the first conductive type semiconductor layer in a first direction, wherein each of the plurality of first electrodes is overlapped with different regions of the second electrode in a vertical direction, wherein each of the plurality of the first electrodes is closer to an edge part of the substrate than to a center region of the substrate, and wherein the first electrode layer is disposed on a lead electrode.

* * * * *